United States Patent
Huang et al.

(10) Patent No.: US 11,303,498 B2
(45) Date of Patent: Apr. 12, 2022

(54) DATA TRANSMISSION METHOD AND APPARATUS BASED ON PROBABILITY NON-UNIFORM MODULATION

(71) Applicant: Huawei Technologies Co., Ltd., Shenzhen (CN)

(72) Inventors: Wei Huang, Shenzhen (CN); Ping Fang, Shenzhen (CN)

(73) Assignee: HUAWEI TECHNOLOGIES CO., LTD., Shenzehn (CN)

( * ) Notice: Subject to any disclaimer, the term of this patent is extended or adjusted under 35 U.S.C. 154(b) by 0 days.

(21) Appl. No.: 17/046,500

(22) PCT Filed: Apr. 12, 2019

(86) PCT No.: PCT/CN2019/082343
§ 371 (c)(1),
(2) Date: Oct. 9, 2020

(87) PCT Pub. No.: WO2019/196913
PCT Pub. Date: Oct. 17, 2019

(65) Prior Publication Data
US 2021/0111940 A1 Apr. 15, 2021

(30) Foreign Application Priority Data

Apr. 12, 2018 (CN) .......................... 201810327455.2
Jul. 27, 2018 (CN) .......................... 201810847877.2

(51) Int. Cl.
*H04B 10/00* (2013.01)
*H04L 5/12* (2006.01)
(Continued)

(52) U.S. Cl.
CPC ....... *H04L 27/366* (2013.01); *H04B 10/5161* (2013.01); *H04L 1/0003* (2013.01); *H04L 25/4917* (2013.01)

(58) Field of Classification Search
CPC . H04L 27/366; H04L 1/0003; H04L 25/4917; H04L 1/0058; H04L 1/18;
(Continued)

(56) References Cited

U.S. PATENT DOCUMENTS

2010/0058140 A1* 3/2010 Matsumoto ........ H03M 13/1177
714/752
2012/0250785 A1 10/2012 Vidal et al.
(Continued)

FOREIGN PATENT DOCUMENTS

CN 1490972 A 4/2004
CN 102111357 A 6/2011
(Continued)

OTHER PUBLICATIONS

Duda, J., "Nonuniform probability modulation for reducing energy consumption of remote sensors," arXiv:1608.04271v1 [cs.IT], Aug. 15, 2016, 7 pages.
(Continued)

*Primary Examiner* — Don N Vo
(74) *Attorney, Agent, or Firm* — Conley Rose, P.C.

(57) ABSTRACT

A data transmission method includes generating a physical layer data frame, where the physical layer data frame includes data on which probability non-uniform modulation is performed and indication information, where the indication information indicates demodulation parameters for performing probability non-uniform demodulation on the data, where the demodulation parameters include a modulation scheme for probability non-uniform modulation, a modulation order for probability non-uniform modulation, and at least one of a probability of each constellation symbol on which probability non-uniform modulation is performed, or a mapping relationship between each constellation symbol on which probability non-uniform modulation is performed (Continued)

and a bit stream, sending the physical layer data frame to a receive end, receiving the physical layer data frame, determining the demodulation parameters based on the indication information, and performing probability non-uniform demodulation on the data based on the demodulation parameters.

20 Claims, 7 Drawing Sheets

(51) Int. Cl.
   *H04L 27/36* (2006.01)
   *H04B 10/516* (2013.01)
   *H04L 1/00* (2006.01)
   *H04L 25/49* (2006.01)

(58) Field of Classification Search
   CPC ... H04L 1/0045; H04L 1/0041; H04L 1/0033; H04L 1/0036; H04L 27/0012; H04L 27/36; H04L 27/38; H04B 10/5161; H03M 13/25
   USPC .................................. 398/158; 375/260, 261
   See application file for complete search history.

(56) References Cited

U.S. PATENT DOCUMENTS

| | | | |
|---|---|---|---|
| 2015/0163085 A1 | 6/2015 | Stadelmeier et al. | |
| 2015/0358195 A1* | 12/2015 | Kim | H04L 1/0086 370/207 |
| 2016/0204873 A1 | 7/2016 | Perez De Aranda Alonso et al. | |
| 2016/0249349 A1 | 8/2016 | Trainin et al. | |
| 2016/0315704 A1 | 10/2016 | Djordjevic et al. | |
| 2016/0323064 A1 | 11/2016 | Ouchi | |
| 2017/0353340 A1* | 12/2017 | Raphaeli | H04L 27/2615 |
| 2018/0091225 A1* | 3/2018 | Wang | H04B 10/541 |
| 2019/0109752 A1* | 4/2019 | Zhang | H04L 27/345 |
| 2019/0305996 A1* | 10/2019 | Handte | H04L 5/0044 |

FOREIGN PATENT DOCUMENTS

| | | |
|---|---|---|
| CN | 102694765 A | 9/2012 |
| CN | 103036845 A | 4/2013 |
| CN | 104429033 A | 3/2015 |
| CN | 105846880 A | 8/2016 |
| JP | 2012217151 A | 11/2012 |
| JP | 2015204474 A | 11/2015 |
| JP | 2016140064 A | 8/2016 |
| WO | 2013144886 A2 | 10/2013 |
| WO | 2015115079 A1 | 8/2015 |

OTHER PUBLICATIONS

Balan, D., et al.,"Hands-on Analysis of 802.11ac Modulation and Coding Scheme", International Journal of Wireless Communications and Mobile Computing,Published online Aug. 31, 2015, pp. 46-50.

Er-Rahmadi, B., et al.,"Enhanced uplink multi-users scheduling for future 802.11ax networks: wait-to-pick-as-available enhanced", Wireless Communications and Mobile Computing, Wireless Communications and Mobile Computing 2016; 16, pp. 3104-3122.

Smith, J.G., "The information capacity of amplitude-and variance-constrained sclar gaussian channels", Information and Control, 1971, 18 (3), pp. 203-219.

Farid, A., et al., "Channel capacity and non-uniform signalling for free-space optical intensity channels", IEEE Journal an Selected Areas in Communications, vol. 27, No. 9, Dec. 2009, 12 pages.

Huang, W., et al., "Characteristics and performance of image sensor communication", IEEE Photonics Journal. vol. 9, No. 2, Apr. 2017, pp. 1-19.

Cao., J., et al., "Capacity and nonuniform signaling for discrete-time Poisson channels", Journal of Optical Communications and Networking, vol. 5, No. 4, Apr. 2013, pp. 329-337.

Nakamura, T., et al., "LLR Generation of 4D Modulation Based on Inverse Code," The Papers of Technical Meeting on communications, IEE Japan, CMN-16-48, Nov. 10, 2016, 11 pages.

* cited by examiner

DATA TRANSMISSION METHOD AND APPARATUS BASED ON PROBABILITY NON-UNIFORM MODULATION

CROSS-REFERENCE TO RELATED APPLICATIONS

This application is a U.S. National Stage of International Patent Application No. PCT/CN2019/082343 filed on Apr. 12, 2019, which claims priority to Chinese Patent Application No. 201810327455.2 filed on Apr. 12, 2018 and Chinese Patent Application No. 201810847877.2 filed on Jul. 27, 2018. All of the aforementioned applications are hereby incorporated by reference in their entireties.

TECHNICAL FIELD

This application relates to the field of communications technologies, and in particular, to a data transmission method and apparatus based on probability non-uniform modulation.

BACKGROUND

In the prior art, most modulation technologies (for example, conventional quadrature amplitude modulation (Quadrature Amplitude Modulation, QAM for short)) are modulation technologies that have a same constellation symbol probability and that are designed without considering constraint conditions such as a noise distribution and a power limitation. In such modulation technologies, a channel capacity is insufficient or bit error rate performance is not good when there are input amplitude constraints or different noise distributions.

SUMMARY

Embodiments of this application provide a data transmission method and apparatus based on probability non-uniform modulation, to improve transmission efficiency of data on which probability non-uniform modulation is performed.

According to one aspect, the embodiments provided in this application include:

1. A data transmission method based on probability non-uniform modulation includes: generating, by a transmit end, a physical layer data frame, where the physical layer data frame includes data on which probability non-uniform modulation is performed and indication information, the indication information is used to indicate demodulation parameters for performing probability non-uniform demodulation on the data, the demodulation parameters include a modulation scheme for probability non-uniform modulation and a modulation order for probability non-uniform modulation, and the demodulation parameters further include at least one of the following: a probability of each constellation symbol on which probability non-uniform modulation is performed, and a mapping relationship between each constellation symbol on which probability non-uniform modulation is performed and a bit stream; and sending, by the transmit end, the physical layer data frame to a receive end. In the method provided in this embodiment, the transmit end sends the data on which probability non-uniform modulation is performed to the receive end, and the receive end performs probability non-uniform demodulation on the data, so that a communications system can obtain a better shaping gain, and when there is an input amplitude constraint or on a channel with shot noise, a transmission rate is made closer to a channel capacity or better bit error rate performance is obtained, thereby improving transmission efficiency of the data on which probability non-uniform modulation is performed.

2. According to Embodiment 1, the demodulation parameters further include a quantity of bits corresponding to each constellation symbol on which probability non-uniform modulation is performed. In this embodiment, the transmit end may send a plurality of demodulation parameters for probability non-uniform modulation to the receive end, to improve correctness of demodulation performed by the receive end on a probability non-uniform constellation symbol.

3. According to Embodiment 1 or 2, the indication information is the demodulation parameters. In this embodiment, the transmit end may explicitly indicate the demodulation parameters, to reduce demodulation complexity of the receive end.

4. According to Embodiment 1 or 2, the indication information is a first identifier, and the first identifier is used to indicate the demodulation parameters. In this embodiment, the transmit end needs to add only the first identifier to the physical layer data frame to enable the receive end to obtain the demodulation parameters, without needing to add all the demodulation parameters to the physical layer data frame, so that the demodulation parameters for probability non-uniform demodulation are carried with a relatively small information redundancy, thereby improving transmission efficiency, and saving transmission resources.

5. According to Embodiment 1 or 2, the indication information includes a second identifier and a first information portion of the demodulation parameters, the second identifier is used to indicate a second information portion of the demodulation parameters, and the demodulation parameters include the first information portion and the second information portion. In this embodiment, the transmit end adds the second identifier to the physical layer data frame, and adds some of the demodulation parameters (that is, the first information portion) to the physical layer data frame, so that the receive end can directly obtain the some of the demodulation parameters, thereby reducing a demodulation delay and demodulation complexity of a demodulator while ensuring transmission efficiency.

6. According to Embodiment 5, the first information portion includes information A and information B, where the information A is a probability of each constellation symbol on which probability non-uniform modulation is performed, the information B is a mapping relationship between each constellation symbol on which probability non-uniform modulation is performed and a bit stream, and the information A and the information B are located in different fields in a physical layer header of the physical layer data frame. In this embodiment, the transmit end adds some of the demodulation parameters (that is, the first information portion) to the physical layer data frame, so that the receive end can directly obtain the some of the demodulation parameters, thereby reducing a demodulation delay and demodulation complexity of a demodulator while ensuring transmission efficiency.

7. According to any one of Embodiment 1 to Embodiment 6, the data transmission method based on probability non-uniform modulation further includes: before the transmit end generates the physical layer data frame, generating, by the transmit end, the data by using a multi-level coder and a deterministic equal-length mapper; or before the transmit end generates the physical layer data frame, generating, by the transmit end, the data by using a single-level coder and a deterministic equal-length mapper. In this embodiment, the transmit end may generate the data in the physical layer data frame in a plurality of manners.

8. According to any one of Embodiment 1 to Embodiment 7, the indication information is located in the physical layer header of the physical layer data frame.

9. According to any one of Embodiment 1 to Embodiment 8, the physical layer data frame is used for optical wireless communications.

10. A data transmission method based on probability non-uniform modulation includes: receiving, by a receive end, a physical layer data frame, w % here the physical layer data frame includes data on which probability non-uniform modulation is performed and indication information, the indication information is used to indicate demodulation parameters for performing probability non-uniform demodulation on the data, the demodulation parameters include a modulation scheme for probability non-uniform modulation and a modulation order for probability non-uniform modulation, and the demodulation parameters further include at least one of the following: a probability of each constellation symbol on which probability non-uniform modulation is performed, and a mapping relationship between each constellation symbol on which probability non-uniform modulation is performed and a bit stream; determining, by the receive end, the demodulation parameters based on the indication information: and performing, by the receive end, probability non-uniform demodulation on the data based on the demodulation parameters. In this embodiment, a transmit end sends the data on which probability non-uniform modulation is performed to the receive end, and the receive end performs probability non-uniform demodulation on the data, so that a communications system can obtain a better shaping gain, and when there is an input amplitude constraint or on a channel with shot noise, a transmission rate is made closer to a channel capacity or better bit error rate performance is obtained, thereby improving transmission efficiency of the data on which probability non-uniform modulation is performed.

11. According to Embodiment 10, the demodulation parameters further include a quantity of bits corresponding to each constellation symbol on which probability non-uniform modulation is performed. In this embodiment, the transmit end may send a plurality of demodulation parameters for probability non-uniform modulation to the receive end, to improve correctness of demodulation performed by the receive end on a probability non-uniform constellation symbol.

12. According to Embodiment 10 or 11, the indication information is the demodulation parameters. In this embodiment, the transmit end may explicitly indicate the demodulation parameters, to reduce demodulation complexity of the receive end.

13. According to Embodiment 10 or 11, the indication information is a first identifier, and the first identifier is used to indicate the demodulation parameters; and the determining, by the receive end, the demodulation parameters based on the indication information includes: determining, by the receive end based on the first identifier and a correspondence between identifiers and demodulation parameters, the demodulation parameters for performing probability non-uniform demodulation on the data, where the identifiers include the first identifier. In this embodiment, the transmit end needs to add only the first identifier to the physical layer data frame to enable the receive end to obtain the demodulation parameters, without needing to add all the demodulation parameters to the physical layer data frame, so that the demodulation parameters for probability non-uniform demodulation are carried with a relatively small information redundancy, thereby improving transmission efficiency, and saving transmission resources.

14. According to Embodiment 10 or 11, the indication information includes a second identifier and a first information portion of the demodulation parameters, the second identifier is used to indicate a second information portion of the demodulation parameters, and the demodulation parameters include the first information portion and the second information portion; and the determining, by the receive end, the demodulation parameters based on the indication information includes: obtaining, by the receive end, the first information portion of the demodulation parameters based on the physical layer data frame; and determining, by the receive end based on the second identifier and a correspondence between identifiers and demodulation parameters, the second information portion of the demodulation parameters for performing probability non-uniform demodulation on the data, where the identifiers include the second identifier. In this embodiment, the transmit end adds the second identifier to the physical layer data frame, and adds some of the demodulation parameters (that is, the first information portion) to the physical layer data frame, so that the receive end can directly obtain the some of the demodulation parameters, thereby reducing a demodulation delay and demodulation complexity of a demodulator while ensuring transmission efficiency.

15. According to Embodiment 14, the first information portion includes information A and information B, where the information A is a probability of each constellation symbol on which probability non-uniform modulation is performed, the information B is a mapping relationship between each constellation symbol on which probability non-uniform modulation is performed and a bit stream, and the information A and the information B are located in different fields in a physical layer header of the physical layer data frame. In this embodiment, the transmit end adds some of the demodulation parameters (that is, the first information portion) to the physical layer data frame, so that the receive end can directly obtain the some of the demodulation parameters, thereby reducing a demodulation delay and demodulation complexity of a demodulator while ensuring transmission efficiency.

16. According to any one of Embodiment 10 to Embodiment 15, the performing, by the receive end, probability non-uniform demodulation on the data based on the demodulation parameters includes: when the transmit end generates the data by using a multi-level coder and a deterministic equal-length mapper, performing, by the receive end, probability non-uniform demodulation on the data by using a multi-level decoder and the demodulation parameters; or when the transmit end generates the data by using a single-level coder and a deterministic equal-length mapper, performing, by the receive end, probability non-uniform demodulation on the data by using a joint demapping decoder and the demodulation parameters. In this embodiment, when data is generated in a plurality of manners, the receive end may perform demodulation in a corresponding demodulation manner.

17. According to any one of Embodiment 10 to Embodiment 16, the indication information is located in the physical layer header of the physical layer data frame.

18. According to any one of Embodiment 10 to Embodiment 17, the physical layer data frame is used for optical wireless communications.

19. A data transmission apparatus based on probability non-uniform modulation includes a processing unit and a communications unit, where the processing unit is configured to generate a physical layer data frame, where the physical layer data frame includes data on which probability non-uniform modulation is performed and indication information, the indication information is used to indicate demodulation parameters for performing probability non-uniform demodulation on the data, the demodulation parameters include a modulation scheme for probability non-uniform modulation and a modulation order for probability non-uniform modulation, and the demodulation parameters further include at least one of the following: a probability of each constellation symbol on which probability non-uniform modulation is performed, and a mapping relationship between each constellation symbol on which probability non-uniform modulation is performed and a bit stream; and the communications unit is configured to send the physical layer data frame to a receive end.

20. According to Embodiment 19, the demodulation parameters further include a quantity of bits corresponding to each constellation symbol on which probability non-uniform modulation is performed.

21. According to Embodiment 19 or 20, the indication information is the demodulation parameters.

22. According to Embodiment 19 or 20, the indication information is a first identifier, and the first identifier is used to indicate the demodulation parameters.

23. According to Embodiment 19 or 20, the indication information includes a second identifier and a first information portion of the demodulation parameters, the second identifier is used to indicate a second information portion of the demodulation parameters, and the demodulation parameters include the first information portion and the second information portion.

24. According to Embodiment 23, the first information portion includes information A and information B, where the information A is a probability of each constellation symbol on which probability non-uniform modulation is performed, the information B is a mapping relationship between each constellation symbol on which probability non-uniform modulation is performed and a bit stream, and the information A and the information B are located in different fields in a physical layer header of the physical layer data frame.

25. According to any one of Embodiment 19 to Embodiment 24, the processing unit is further configured to generate the data by using a multi-level coder and a deterministic equal-length mapper, or generate the data by using a single-level coder and a deterministic equal-length mapper.

26. According to any one of Embodiment 19 to Embodiment 25, the indication information is located in the physical layer header of the physical layer data frame.

27. According to any one of Embodiment 19 to Embodiment 26, the physical layer data frame is used for optical wireless communications.

28. A data transmission apparatus based on probability non-uniform modulation includes a processing unit and a communications unit, where the communications unit is configured to receive a physical layer data frame, where the physical layer data frame includes data on which probability non-uniform modulation is performed and indication information, the indication information is used to indicate demodulation parameters for performing probability non-uniform demodulation on the data, the demodulation parameters include a modulation scheme for probability non-uniform modulation and a modulation order for probability non-uniform modulation, and the demodulation parameters further include at least one of the following: a probability of each constellation symbol on which probability non-uniform modulation is performed, and a mapping relationship between each constellation symbol on which probability non-uniform modulation is performed and a bit stream; the processing unit is configured to determine the demodulation parameters based on the indication information: and the processing unit is configured to perform probability non-uniform demodulation on the data based on the demodulation parameters.

29. According to Embodiment 28, the demodulation parameters further include a quantity of bits corresponding to each constellation symbol on which probability non-uniform modulation is performed.

30. According to Embodiment 28 or 29, the indication information is the demodulation parameters.

31. According to Embodiment 28 or 29, the indication information is a first identifier, and the first identifier is used to indicate the demodulation parameters. The processing unit is specifically configured to determine, based on the first identifier and a correspondence between identifiers and demodulation parameters, the demodulation parameters for performing probability non-uniform demodulation on the data, where the identifiers include the first identifier.

32. According to Embodiment 28 or 29, the indication information includes a second identifier and a first information portion of the demodulation parameters, the second identifier is used to indicate a second information portion of the demodulation parameters, and the demodulation parameters include the first information portion and the second information portion. The processing unit is specifically configured to obtain the first information portion of the demodulation parameters based on the physical layer data frame; and determine, based on the second identifier and a correspondence between identifiers and demodulation parameters, the second information portion of the demodulation parameters for performing probability non-uniform demodulation on the data, where the identifiers include the second identifier.

33. According to Embodiment 32, the first information portion includes information A and information B, where the information A is a probability of each constellation symbol on which probability non-uniform modulation is performed, the information B is a mapping relationship between each constellation symbol on which probability non-uniform modulation is performed and a bit stream, and the information A and the information B are located in different fields in a physical layer header of the physical layer data frame.

34. According to any one of Embodiment 28 to Embodiment 33, the processing unit is further configured to: when the data is generated by using a multi-level coder and a deterministic equal-length mapper, perform probability non-uniform demodulation on the data by using a multi-level decoder and the demodulation parameters; or when the data is generated by using a single-level coder and a deterministic equal-length mapper, perform probability non-uniform demodulation on the data by using a joint demapping decoder and the demodulation parameters.

35. According to any one of Embodiment 28 to Embodiment 34, the indication information is located in the physical layer header of the physical layer data frame.

36. According to any one of Embodiment 28 to Embodiment 35, the physical layer data frame is used for optical wireless communications.

37. A data transmission apparatus based on probability non-uniform modulation includes a memory and a processor, where the memory is configured to store a computer executable instruction, and the processor executes the computer executable instruction stored in the memory, so that the data transmission apparatus based on probability non-uniform modulation implements the data transmission method based on probability non-uniform modulation according to any one of Embodiment 1 to Embodiment 9.

38. A data transmission apparatus based on probability non-uniform modulation includes a memory and a processor, where the memory is configured to store a computer executable instruction, and the processor executes the computer executable instruction stored in the memory, so that the data transmission apparatus based on probability non-uniform modulation implements the data transmission method based on probability non-uniform modulation according to any one of Embodiment 10 to Embodiment 18.

39. A data transmission apparatus based on probability non-uniform modulation includes one or more processors, one or more memories, one or more baseband processing modules, one or more light source drivers, and one or more light sources. The memory is configured to store a program instruction. The processor is configured to control, according to the program instruction stored in the memory, the baseband processing module, the light source driver, and the light source to perform the method according to any one of Embodiment 1 to Embodiment 9. The baseband processing module is configured to generate a physical layer data frame, and send the physical layer data frame to the light source driver. The light source driver is configured to generate a direct current or a direct current voltage, superpose the received physical layer data frame with the direct current or the direct current voltage to generate an electrical signal with a bias, and send the electrical signal with a bias to the light source. The light source is configured to generate an optical signal based on the electrical signal with a bias.

40. A data transmission apparatus based on probability non-uniform modulation includes one or more processors, one or more memories, one or more baseband processing modules, one or more photoelectric detectors, and one or more optical antennas. The memory is configured to store a program instruction. The processor is configured to control, according to the program instruction stored in the memory, the baseband processing module, the photoelectric detector, and the optical antenna to perform the method according to any one of Embodiment 10 to Embodiment 18. The optical antenna is configured to receive an optical signal, and send the optical signal to the photoelectric detector. The photoelectric detector is configured to receive the optical signal, convert the optical signal into an electrical signal with a bias, and send the electrical signal with a bias to the baseband processing module, where the electrical signal with a bias is a current signal with a bias or a voltage signal with a bias. The baseband processing module is configured to receive the electrical signal with a bias, perform signal processing on the electrical signal with a bias to obtain a physical layer data frame, and perform probability non-uniform demodulation processing and decoding processing on data based on a probability non-uniform demodulation parameter, where the probability non-uniform demodulation parameter is a demodulation parameter indicated by indication information in the physical layer data frame, and the data is data that is carried in the physical layer data frame and on which probability non-uniform modulation is performed.

41. A computer-readable storage medium includes an instruction, where when the instruction is run on a computer, the computer is enabled to perform any method according to any one of Embodiment 1 to Embodiment 18.

42. A computer program product includes an instruction, where when the computer program product is run on a computer, the computer is enabled to perform any method according to any one of Embodiment 1 to Embodiment 18.

For beneficial effects of any one of Embodiment 19 to Embodiment 42, refer to technical effects brought by corresponding embodiments in Embodiment 1 to Embodiment 18. Details are not described herein again.

According to another aspect, the embodiments provided in this application further include (there is no clear correspondence between numbers of embodiments provided in this part and numbers of embodiments provided in other parts of this specification, and this is merely for ease of description in this part):

1. A data transmission method based on probability non-uniform modulation is applied to a transmit end, and includes: The transmit end generates a physical layer data frame, and performs probability non-uniform modulation. The physical layer data frame carries various parameter information required for completing probability non-uniform signal demodulation or carries identifier information that can represent/map the parameter information. The various parameter information required for completing probability non-uniform signal demodulation includes a modulation type, a quantity of bits carried in each symbol, a modulation order, a constellation symbol probability, and a mapping relationship between a constellation symbol and a bit stream. Various parameter information that is carried in the data frame and that can be used to complete probability non-uniform modulation and demodulation or identifier information that represents the parameter information is placed in a physical layer header, and a check sequence is required for check protection. The probability non-uniform constellation symbol may be extended to N-dimensional signal space (N≥1 and N is a positive integer).

2. According to Embodiment 1, the method further includes: The physical layer data frame can directly carry the various parameter information that is required to support completing probability non-uniform modulation and demodulation on data in the frame, or indirectly carry identifier information that can represent/map the parameter information.

3. According to Embodiment 1 or 2, the method further includes: The physical layer data frame may indirectly carry probability coding policy PMCS-ID identifier information of parameter information that is required to support completing probability non-uniform modulation and demodulation on data in the frame. The PMCS-ID identifier is placed in a physical layer header, and each identifier segment in the PMCS-ID identifier identifies a modulation type of probability non-uniform modulation, a quantity of bits carried in each type of coded symbol, a modulation order, a constellation symbol probability, and a parameter of a mapping relationship between a constellation symbol and a bit stream. Parameter information to which the PMCS-ID identifier is mapped may be preset in the transmit end and a receive end in a manner in which a relationship between an identifier and each parameter information can be mapped, such as a probability modulation and coding table.

4. According to Embodiment 1, the method further includes: The physical layer data frame may both directly carry parameter information that is required to support completing probability non-uniform modulation and demodulation on data in the frame and indirectly carry identifier information of parameter information required for demodulation, where the modulation type and parameter information of a quantity of bits carried in each type of coded symbol are represented by using an identifier; and directly carry, by adding and loading a MOP module and a BSM module to a physical layer, the modulation order for probability non-uniform modulation, the constellation symbol probability, and the parameter information of the mapping relationship between a constellation symbol and a bit stream.

5. A data transmission method based on probability non-uniform modulation is applied to a receive end and includes: The receive end receives the physical layer data frame, and obtains, in a specific manner, various parameter information required for completing probability non-uniform signal demodulation. After a check is successful, a demodulator completes probability non-uniform signal demodulation by using the parameter information. The various parameter information required for completing probability non-uniform signal demodulation includes a modulation type of probability non-uniform modulation, a quantity of bits carried in each type of coded symbol, a modulation order, a constellation symbol probability, and a parameter of a mapping relationship between a constellation symbol and a bit stream.

6. According to Embodiment 5, the method further includes: The receive end can directly or indirectly obtain the various parameter information required for completing probability non-uniform signal demodulation.

7. According to Embodiment 5 or 6, the method further includes: When a PMCS-ID identifier in a physical layer header of the received data frame can represent various parameter information required for probability non-uniform demodulation, the demodulator may learn of, in a manner such as querying a probability modulation and coding table to obtain a mapping relationship between PMCS-ID identifiers and various parameters required for demodulation, a modulation type of data in the frame, a quantity of bits carried in each type of coded symbol, a modulation order, a constellation symbol probability, and parameter information of a mapping relationship between a constellation symbol and a bit stream, for decoding.

8. According to Embodiment 5 or 6, the method further includes: When a PMCS-ID identifier in a physical layer header of the received data frame is used only to identify the modulation type of probability non-uniform modulation and the parameter information of the quantity of bits carried in each type of coded symbol, the receive end further needs to directly extract, from a MOP module and a BSM module that are placed and loaded in the physical layer header, the modulation order for probability non-uniform modulation, the constellation symbol probability, and parameter information of a mapping relationship between a constellation symbol and a bit stream. After various parameter information required for probability non-uniform demodulation is obtained, demodulation is performed.

9. According to Embodiment 5, the method further includes: After obtaining various parameter information required for probability non-uniform demodulation, the receive end performs, by using a message passing/propagation algorithm (MP algorithm) that can use soft information, such as a sum-product algorithm, joint demodulation and decoding on a signal on which probability non-uniform modulation is performed.

10. A data transmission method based on probability non-uniform modulation includes: A transmit end of a communications system suitable for using probability non-uniform modulation generates a physical layer data frame, and performs probability non-uniform modulation on the generated data frame, and a receive end of the communications system performs probability non-uniform signal demodulation after receiving the data frame.

11. According to Embodiment 10, the method further includes: The probability non-uniform constellation symbol may be extended to N-dimensional signal space (N≥1 and N is a positive integer).

12. According to Embodiment 10, the method further includes: The generated physical layer data frame carries various parameter information that is required for supporting the receive end in completing probability non-uniform signal demodulation, including parameter information of a modulation type, a quantity of bits carried in each type of coded symbol, a modulation order, a constellation symbol probability, and a mapping relationship between a constellation symbol and a bit stream. In addition, the data frame further carries parameter information that can support frame synchronization, channel estimation, channel equalization, and the like.

13. According to Embodiment 10, the method further includes: After receiving the physical layer data frame, the receive end first needs to perform frame synchronization. After completing frame synchronization, the receive end further needs to complete channel estimation, channel equalization, and related parameter check. Then a demodulator starts demodulation.

DESCRIPTION OF EMBODIMENTS

Figure 1:
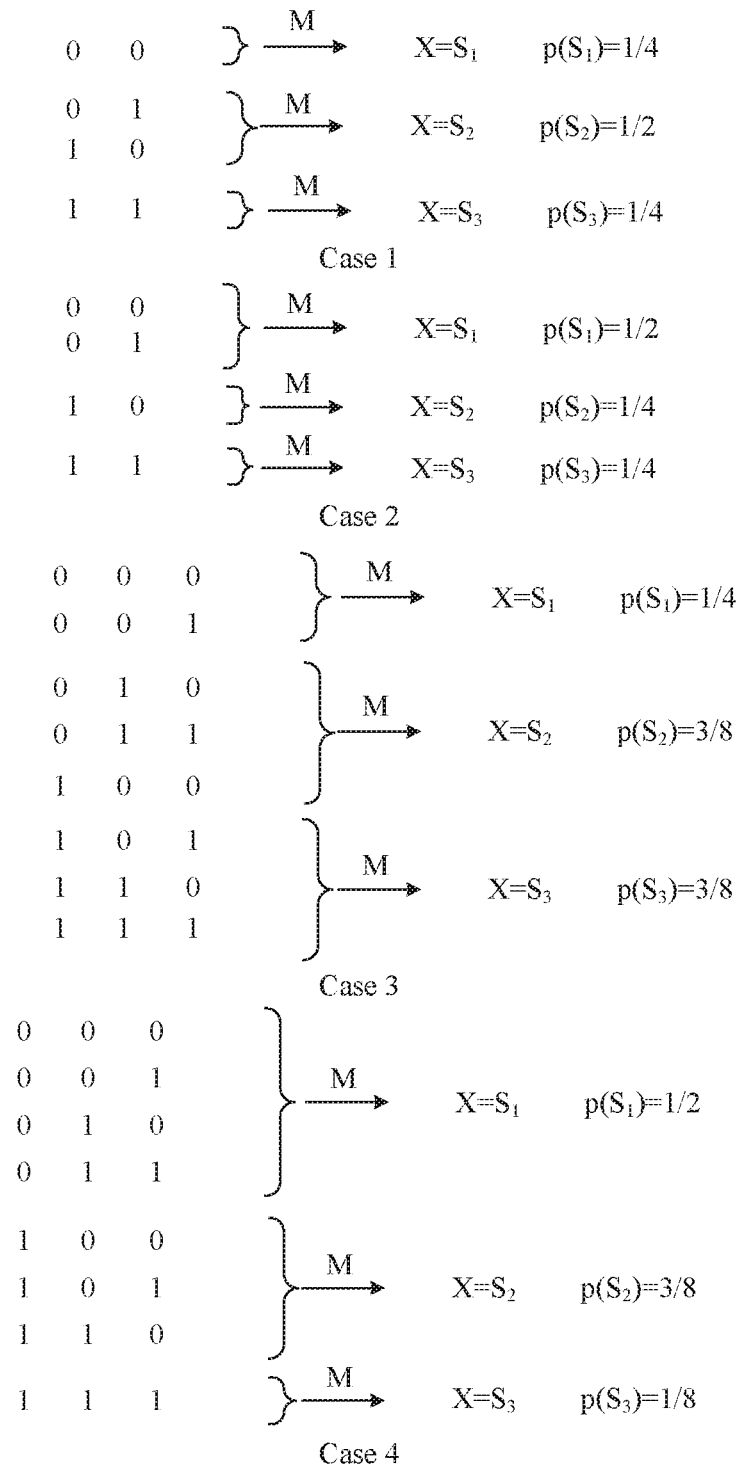
FIG. 1 is a schematic diagram of a mapping between a bit stream group and a constellation symbol according to an embodiment of this application.

The following describes the technical solutions in the embodiments of this application with reference to the accompanying drawings in the embodiments of this application. In the descriptions of this application, unless otherwise specified, "/" means "or". For example, A/B may represent A or B. The term "and/or" in this specification describes only an association relationship for associated objects and represents that three relationships may exist. For example, A and/or B may represent the following three cases: Only A exists, both A and B exist, and only B exists. In addition, "a plurality of" means two or more than two. Words such as "first" and "second" do not limit a quantity and an execution sequence, and words such as "first" and "second" are not necessarily different.

To make the following descriptions clearer, the following briefly describes some concepts in this application.

A modulation scheme may also be referred to as a modulation type, and is a modulation scheme used when a coded bit (or a coded bit stream) is modulated. For example, the modulation scheme may be QAM, quadrature phase shift keying (Quadrature Phase Shift Keying, QPSK for short) modulation, pulse amplitude modulation (Pulse Amplitude Modulation, PAM for short), or the like.

A constellation symbol is a modulation symbol obtained by modulating a coded bit (or a coded bit stream).

A bit quantity corresponding to the constellation symbol may also be described as a quantity of bits carried or included in the constellation symbol, and is a bit quantity of coded bits (or coded bit streams) corresponding to the constellation symbol. Coded bits (or coded bit streams) corresponding to a constellation symbol are modulated or mapped to obtain the constellation symbol.

A modulation order is a quantity of constellation symbol types.

A probability of a constellation symbol is a theoretical proportion of the constellation symbol in a constellation symbol set. For example, if a theoretical proportion of a constellation symbol $S_2$ in a constellation symbol set is 3/8, a probability of the constellation symbol is 3/8. When probabilities of a plurality of types of constellation symbols are the same, the constellation symbols may be referred to as probability uniform constellation symbols. When probabilities of at least two types of constellation symbols in the plurality of types of constellation symbols are different, the constellation symbols may be referred to as probability non-uniform constellation symbols. The probability non-uniform constellation symbol may be obtained after a non-equal-length mapper or a probability non-uniform mapper modulates or maps coded bits (or a coded bit stream).

A probability of a coded bit is a theoretical proportion of a coded bit with a specific value in a coded bit stream. For example, if a theoretical proportion of a coded bit whose value is 1 in a coded bit stream is 1/2, a probability of the coded bit is 1/2. When probabilities of coded bits with different values are the same, the coded bits may be referred to as equal-probability coded bits; otherwise, the coded bits may be referred to as non-equal-probability coded bits. Usually, a coded bit stream obtained after channel coding is performed on an original equal-probability bit stream is also an equal-probability coded bit stream. The original bit stream may be a bit stream obtained after source coding.

With development of Internet applications, novel applications such as virtual reality (Virtual Reality, VR for short), augmented reality (Augmented Reality, AR for short), and an ultra high-definition video (Ultra High-Definition Video, UHDV for short), the Internet of Vehicles, and the Internet of Things have higher requirements on performance indicators such as a communication transmission rate, a communication delay, and power consumption. To meet communication requirements of these applications, a plurality of types of wireless technologies such as a new multiple access technology, a new waveform technology, a new modulation scheme, a new coding scheme, a large-scale antenna array, full-spectrum access, and a heterogeneous network are proposed.

Compared with the previous-generation Institute of Electrical and Electronics Engineers (Institute of Electrical and Electronics Engineers, IEEE for short) 802.11ad standard, the IEEE 802.11ay standard have a key technical point of proposing a non-uniform constellation (Non-uniform Constellation) modulation technology. The non-uniform constellation modulation technology is a modulation scheme in which probabilities of constellation symbols are the same and constellation symbol spacings (that is, Euclidean distances, Euclidean Distances) are different. In a conventional modulation scheme in which constellation symbols have a same probability, a plurality of equal-probability coded bits may be mapped to one constellation symbol, there may be a plurality of types of constellation symbols, and probabilities of the plurality of types of constellation symbols are the same.

Due to various types of noise existing at a receive end, an average power constraint at a transmit end, an amplitude constraint of an input signal, and the like, an optimal signal whose transmission rate can achieve a channel capacity is a discrete probability non-uniform constellation symbol. Then the constellation symbol is demodulated in combination with a maximum a posteriori (Maximum a Posteriori, MAP for short) estimation algorithm to achieve a relatively ideal shaping gain and relatively ideal bit error rate performance. Therefore, probability non-uniform modulation is proposed. Probability non-uniform modulation is a modulation scheme in which probabilities of constellation symbols are different, and constellation symbol spacings may be the same or may be different. In a probability non-uniform modulation scheme, a plurality of equal-probability coded bits may be mapped to one constellation symbol, there may be a plurality of types of constellation symbols, and probabilities of at least two types of constellation symbols in the plurality of types of constellation symbols are different. Compared with a conventional probability uniform modulation technology, a probability non-uniform modulation technology can obtain a better shaping gain (Shaping gain), and has better robustness against non-ideal interference such as phase noise (Phase Noise) and quantization noise (QuantizationNoise).

Currently, researches on probability non-uniform modulation are all theoretical researches. In probability non-uniform modulation, because probabilities of constellation symbols are different, a demodulation algorithm of a conventional maximum likelihood (Maximum Likelihood) estimation algorithm based on an assumption that prior probabilities of constellation symbols are same is no longer applicable. A demodulator at the receive end needs to know information such as a probability of each constellation symbol and a modulation order for probability non-uniform modulation, so that the demodulator can demodulate the constellation symbols based on the MAP estimation algorithm.

For clearer understanding of this application, the following briefly describes a principle of probability non-uniform modulation.

Before probability non-uniform modulation is performed, a plurality of bit stream groups may be set, one bit stream group includes one or more bit streams, and one bit stream includes one or more bits. A bit stream in each bit stream group may be mapped to one constellation symbol. Probabilities of constellation symbols to which bit streams in at least two bit stream groups are mapped are different.

In one case, bit streams in the plurality of bit stream groups include a same quantity of bits. For example, referring to FIG. 1, in case 1, three bit stream groups [00], [01, 10], and [11] are set. A constellation symbol to which [00] is mapped is $S_1$, and a probability of $S_1$ is $p(S_1)=1/4$. A constellation symbol to which [01, 10] is mapped is $S_2$, and a probability of $S_2$ is $p(S_2)=1/2$. A constellation symbol to which [11] is mapped is $S_3$, and a probability of $S_3$ is $p(S_3)=1/4$. In case 2, three bit stream groups [00, 01, 110], and [11] are set. A constellation symbol to which [00, 01] is mapped is $S_1$, and a probability of $S_1$ is $p(S_1)=1/2$. A constellation symbol to which [10] is mapped is $S_2$, and a probability of $S_2$ is $p(S_2)=1/4$. A constellation symbol to which [11] is mapped is $S_3$, and a probability of $S_3$ is $p(S_3)=1/4$. In case 3, three bit stream groups [000, 001], [010, 011, 100], and [101, 110, 111] are set. A constellation symbol to which [000, 001] is mapped is $S_1$, and a probability of $S_1$ is $p(S_1)=1/4$. A constellation symbol to which [010, 011, 100] is mapped is $S_2$, and a probability of $S_2$ is $p(S_2)=3/8$. A constellation symbol to which [101, 110, 111] is mapped is $S_3$, and a probability of $S_3$ is $p(S_3)=3/8$. In case 4, three bit stream groups [000, 001, 010, 011], [100, 101, 110], and [111] are set. A constellation symbol to which [000, 001, 010, 011] is mapped is $S_1$, and a probability of $S_1$ is $p(S_1)=1/2$. A constellation symbol to which [100, 101, 110] is mapped is $S_2$, and a probability of $S_2$ is $p(S_2)=3/8$. A constellation symbol to which [111] is mapped is $S_3$, and a probability of $S_3$ is $p(S_3)=1/8$.

Figure 2:
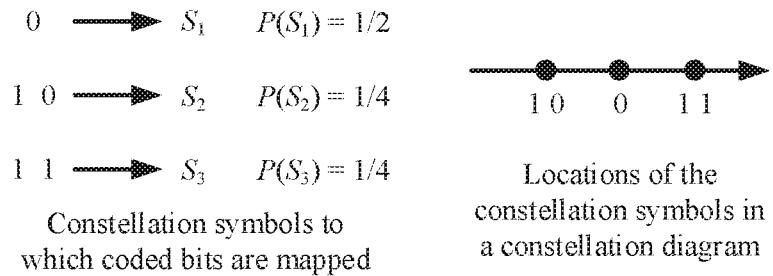
FIG. 2 is a schematic diagram of a mapping between a bit stream group and a constellation symbol and a location of the constellation symbol in a constellation diagram according to an embodiment of this application.

In another case, bit streams in the plurality of bit stream groups include different quantities of bits. For example, referring to FIG. 2, three bit stream groups [0], [10], and [11] are set. A constellation symbol to which [0] is mapped is $S_1$, and a probability of $S_1$ is $p(S_1)=1/2$. A constellation symbol to which [10] is mapped is $S_2$, and a probability of $S_2$ is $p(S_2)=1/4$. A constellation symbol to which [11] is mapped is $S_3$, and a probability of $S_3$ is $p(S_3)=1/4$. In this case, for locations of the constellation symbols in a constellation diagram, refer to FIG. 2.

Figure 3:
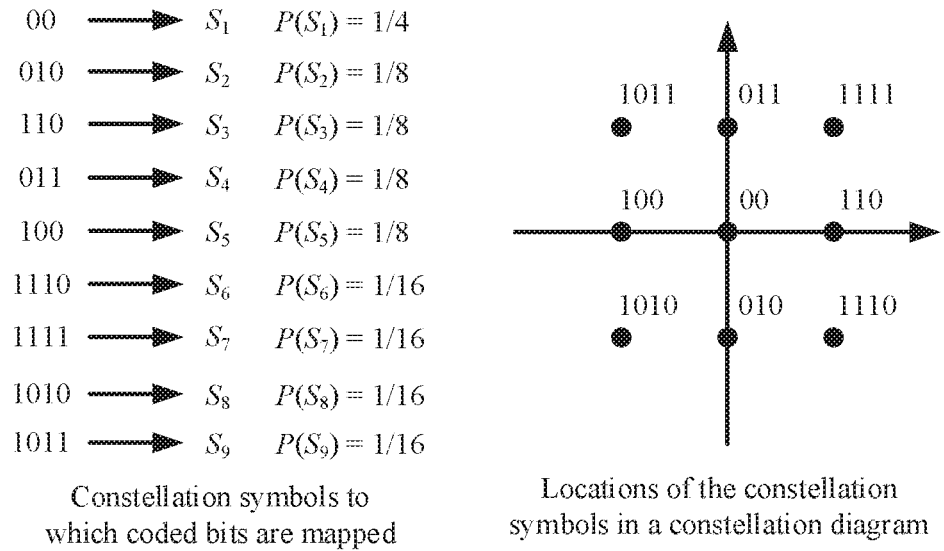
FIG. 3 is a schematic diagram of another mapping between a bit stream group and a constellation symbol and a location of the constellation symbol in a constellation diagram according to an embodiment of this application.

Referring to FIG. 3, nine bit stream groups [00], [010], [110], [011], [100], [1110], [11111], [1010], and [1011] are set. A constellation symbol to which [00] is mapped is $S_1$, and a probability of $S_1$ is $p(S_1)=1/4$. A constellation symbol to which [010] is mapped is $S_2$, and a probability of $S_2$ is $p(S_2)=1/8$. A constellation symbol to which [110] is mapped is $S_3$, and a probability of $S_3$ is $p(S_3)=1/8$. A constellation symbol to which [011] is mapped is $S_4$, and a probability of $S_4$ is $p(S_4)=1/8$. A constellation symbol to which [100] is mapped is $S_5$, and a probability of $S_5$ is $p(S_5)=1/8$. A constellation symbol to which [1110] is mapped is $S_6$, and a probability of $S_6$ is $p(S_{66})=1/16$. A constellation symbol to which [1111] is mapped is $S_7$, and a probability of $S_7$ is $p(S_7)=1/16$. A constellation symbol to which [1010] is mapped is $S_8$, and a probability of $S_8$ is $p(S_8)=1/16$. A constellation symbol to which [1011] is mapped is $S_9$, and a probability of $S_9$ is $p(S_9)=1/16$. In this case, for locations of the constellation symbols in a constellation diagram, refer to FIG. 3.

Based on the example shown in FIG. 1, if a bit stream is 011010, the first bit 0 may be mapped to $S_1$, the second and third bits 11 may be mapped to $S_3$, the fourth bit 0 may be mapped to $S_1$, and the fifth and sixth bits 10 may be mapped to $S_2$. In this case, constellation symbols in a constellation symbol set obtained by mapping 011010 are $S_1$, $S_3$, $S_1$, and $S_2$.

In the description of the principle part of probability non-uniform modulation, the bits in the bit stream may be equal-probability coded bits on which channel coding is performed. The constellation symbol may be a constellation symbol in a PAM constellation symbol set.

The following briefly describes a data processing process at each of a transmit end and a receive end.

Figure 4:
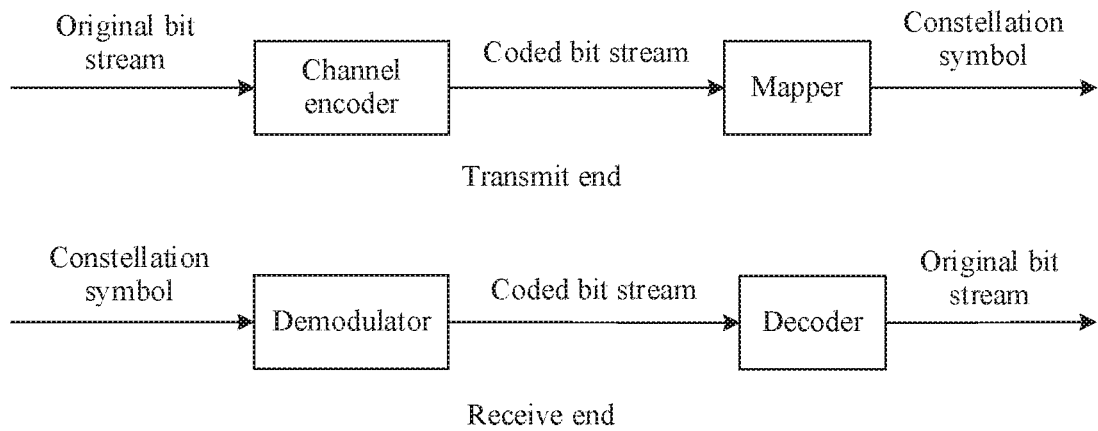
FIG. 4 is a schematic diagram of a data processing process at each of a transmit end and a receive end according to an embodiment of this application.

As shown in FIG. 4, at the transmit end, an original bit stream is channel coded by a channel encoder to obtain a coded bit stream, and the coded bit stream is mapped by a mapper to obtain a constellation symbol. At the receive end, a demodulator demodulates the constellation symbol to obtain a coded bit stream, and a decoder decodes the coded bit stream to obtain the original bit stream. A probability non-uniform constellation symbol in this embodiment of this application may be generated in any one of manner 1 to manner 3.

Figure 5:
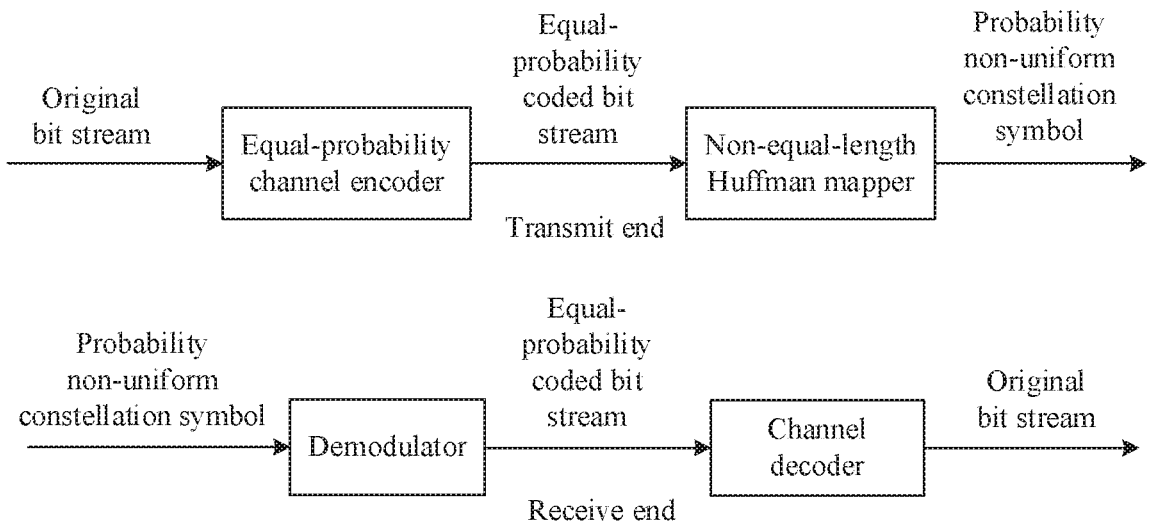
FIG. 5 is a schematic diagram of another data processing process at each of a transmit end and a receive end according to an embodiment of this application.

Manner 1: Referring to FIG. 5, an original bit stream is channel coded by an equal-probability channel encoder to obtain an equal-probability coded bit stream, and the equal-probability coded bit stream is mapped by a non-equal-length Huffman (Huffman) mapper, to generate a probability non-uniform constellation symbol. The demodulator at the receive end demodulates the probability non-uniform constellation symbol based on a learned complete structure of the non-equal-length Huffman mapper to obtain an equal-probability coded bit stream, and the equal-probability coded bit stream is decoded by a channel decoder to obtain the original bit stream.

In this manner, constellation symbols with different modulation orders and frequency band efficiency can be generated relatively flexibly, and a larger shaping gain can be obtained compared with a conventional probability uniform modulation scheme. In this manner, to ensure the shaping gain, a joint source-channel decoding (Joint Source-Channel Decoding, JSCD for short) algorithm may be used to decode the equal-probability coded bit stream.

Figure 6:
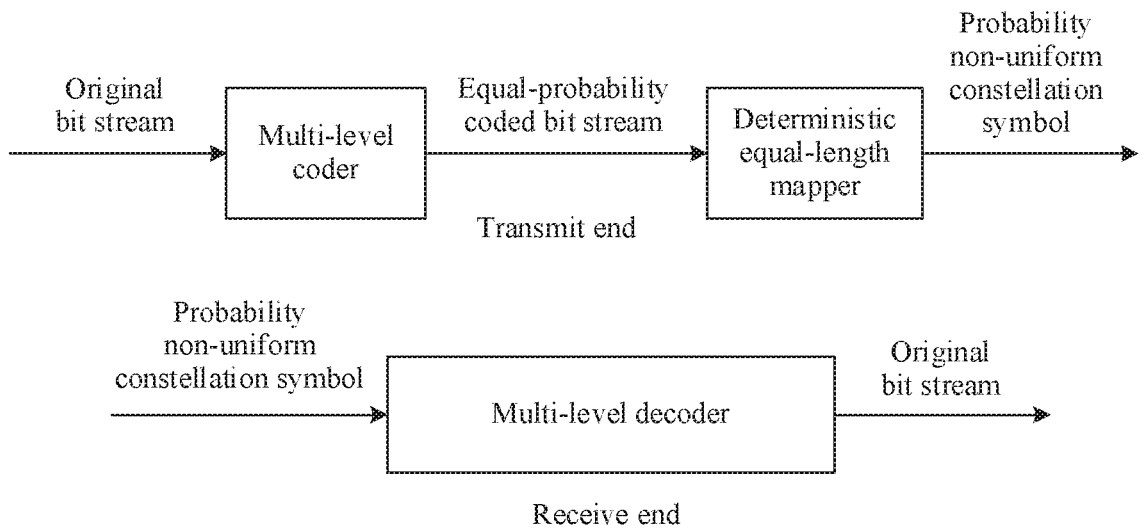
FIG. 6 is a schematic diagram of another data processing process at each of a transmit end and a receive end according to an embodiment of this application.

Manner 2: Referring to FIG. 6, at the transmit end, an original bit stream is channel coded by a multi-level coder (Multi-level Coding, MLC for short) to obtain an equal-probability coded bit stream, and the equal-probability coded bit stream is mapped by a deterministic (deterministic) equal-length mapper, to generate a probability non-uniform constellation symbol. At the receive end, a multi-level decoder (Multi-level Decoding, MSD for short) performs multi-level decoding is performed on the probability non-uniform constellation symbol to obtain the original bit stream.

Figure 7:
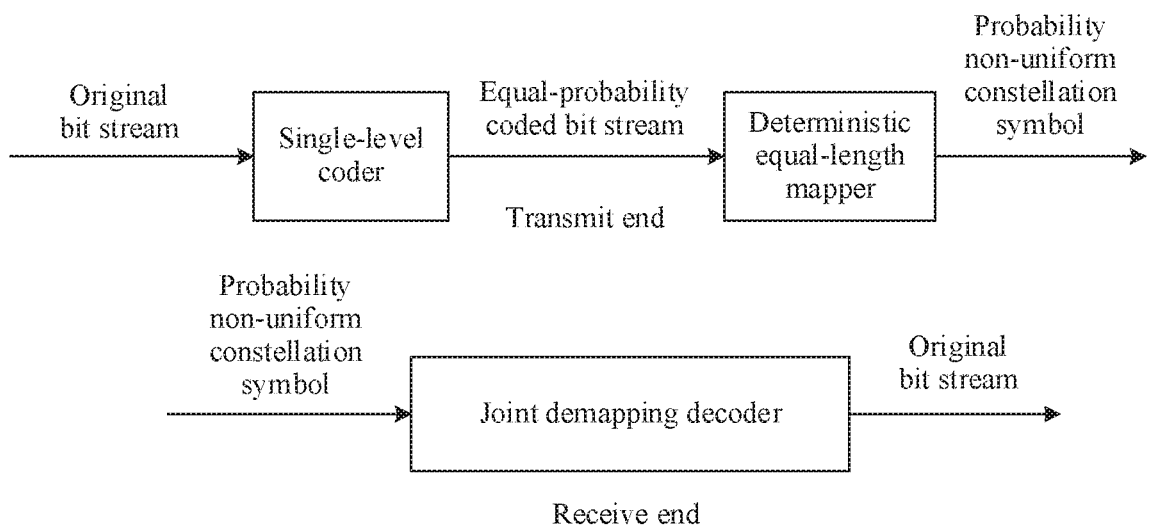
FIG. 7 is a schematic diagram of another data processing process at each of a transmit end and a receive end according to an embodiment of this application.

Manner 3: Referring to FIG. 7, at the transmit end, an original bit stream is channel coded by a single-level coder (Single-level Coding, SLC for short) to obtain an equal-probability coded bit stream, and the equal-probability coded bit stream is mapped by a deterministic equal-length mapper, to generate a probability non-uniform constellation symbol. At the receive end, a joint demapping decoder (Joint Demapping-decoding, JDD for short) demodulates and decodes the probability non-uniform constellation symbol to obtain the original bit stream.

The method provided in this embodiment of this application may be applied to a communications system that uses probability non-uniform modulation, for example, an intensity modulation-direct detection (Intensity Modulation-Direct Detection, IM-DD for short) communications system with a limited input amplitude, or a radio frequency (Radio Frequency, RF for short) communications system with a limited input signal amplitude, or a radio frequency (Radio Frequency, RF for short) communications system with both a limited input signal amplitude and limited noise power. Typical IM-DD communications systems include a visible light communications (Visible Light Communication, VLC for short) system, a free space optics communication (Free Space Optics, FSO for short) system, a camera communication (Optical Camera Communication, OCC for short) system, an optical wireless scattering communication (Optical Wireless Scattering Communication, OWSC for short) system, and other typical optical wireless communications (Optical Wireless Communication, OWC for short) systems.

Figure 8:
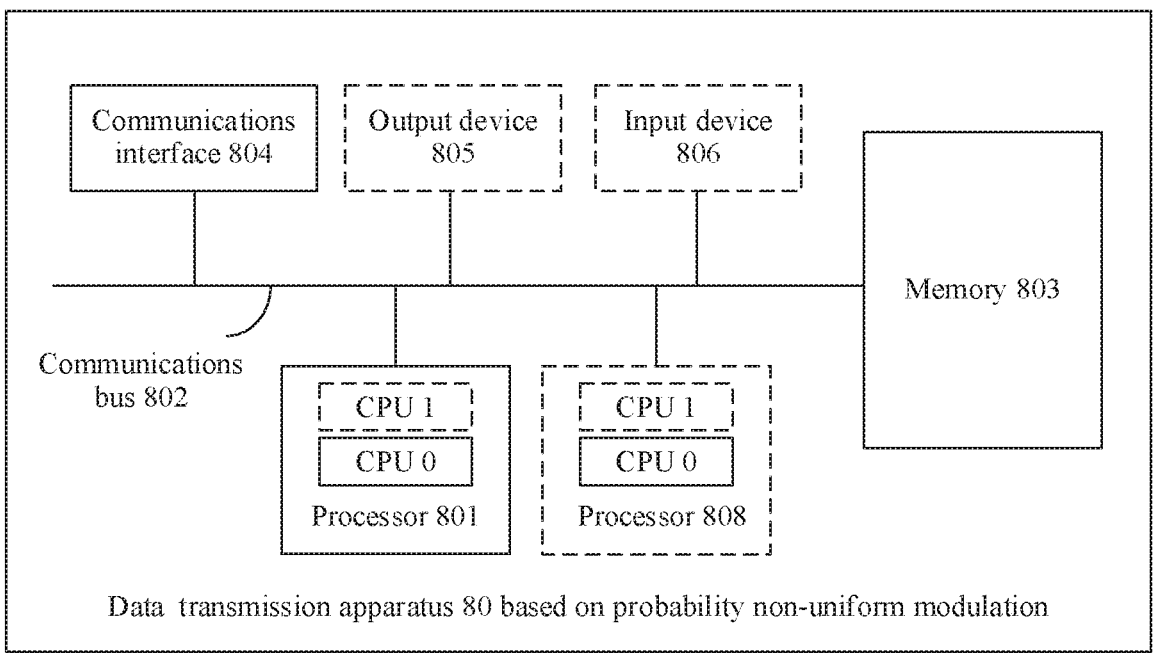
FIG. 8 is a schematic diagram of a hardware structure of a data transmission apparatus based on probability non-uniform modulation according to an embodiment of this application.

An embodiment of this application provides a schematic diagram of a hardware structure of a data transmission apparatus based on probability non-uniform modulation. As shown in FIG. 8, the data transmission apparatus 80 based on probability non-uniform modulation may be a transmit end or a receive end in the following. Specifically, the data transmission apparatus 80 based on probability non-uniform modulation may be a transmit end or a receive end in a radio frequency communication scenario. The data transmission apparatus 80 based on probability non-uniform modulation includes at least one processor (for example, a processor 801 and a processor 808), a communications bus 802, a memory 803, and at least one communications interface 804.

The processor 801 may be one or more general-purpose central processing units (Central Processing Unit, CPU for short), a microprocessor, an application-specific integrated circuit (Application-Specific Integrated Circuit, ASIC for short), or one or more integrated circuits configured to control program execution in the solutions of this application.

The communications bus 802 is configured to communicate between the foregoing components, to transmit information.

The communications interface 804 is configured to communicate with another device or a communications network, and may be any apparatus such as a transceiver, for example, an Ethernet, a radio access network (Radio Access Network, RAN for short) node, or a wireless local area network (Wireless Local Area Networks, WLAN for short).

The memory 803 is configured to store a computer executable instruction for executing the solutions of this application, and the processor 801 controls the execution. The processor 801 is configured to execute the computer executable instruction stored in the memory 803, to implement a method provided in the following embodiments of this application, for example, to perform an action of a transmit end or a receive end in the following. The memory 803 may be a read-only memory (Read-Only Memory, ROM for short) or another type of static storage device that can store static information and an instruction, a random access memory (Random Access Memory, RAM for short) or another type of dynamic storage device that can store information and an instruction, an electrically erasable programmable read-only memory (Electrically Erasable Programmable Read-Only Memory, EEPROM for short), a compact disc read-only memory (Compact Disc Read-Only Memory, CD-ROM for short) or another optical disc storage, an optical disc storage (including a compact disc, a laser disc, an optical disc, a digital versatile disc, a Blu-ray disc, or the like), a disk storage medium or another magnetic storage device, or any other medium that can be configured to carry or store expected program code in a form of an instruction or a data structure and that can be accessed by a computer, but is not limited thereto. The memory 803 may exist independently, and is connected to the processor 801 by using the communications bus 802. Alternatively, the memory 803 may be integrated with the processor 801.

Optionally, the computer executable instruction in this embodiment of this application may also be referred to as application program code. This is not specifically limited in this embodiment of this application.

In an embodiment, the processor 801 may include one or more CPUs, for example, a CPU 0 and a CPU 1 in FIG. 8.

In an embodiment, the data transmission apparatus 80 based on probability non-uniform modulation may include a plurality of processors, for example, the processor 801 and the processor 808 in FIG. 8. Each of these processors may be a single-core (single-CPU) processor, or may be a multi-core (multi-CPU) processor. The processors herein may refer to one or more devices, circuits, and/or processing cores configured to process data (for example, a computer program instruction).

In an embodiment, the data transmission apparatus 80 based on probability non-uniform modulation may further include an output device 805 and an input device 806. The output device 805 communicates with the processor 801, and may display information in a plurality of manners. The input device 806 communicates with the processor 801, and may receive a user input in a plurality of manners.

An embodiment of this application further provides a data transmission apparatus 90 based on probability non-uniform modulation. The data transmission apparatus 90 based on probability non-uniform modulation may be the transmit end in the embodiments of this application. The data transmission apparatus 90 based on probability non-uniform modulation may be a transmit end in a radio frequency communication scenario, or may be a transmit end in an optical wireless communications scenario.

Embodiment 1 Related to a Transmit End

Figure 9:
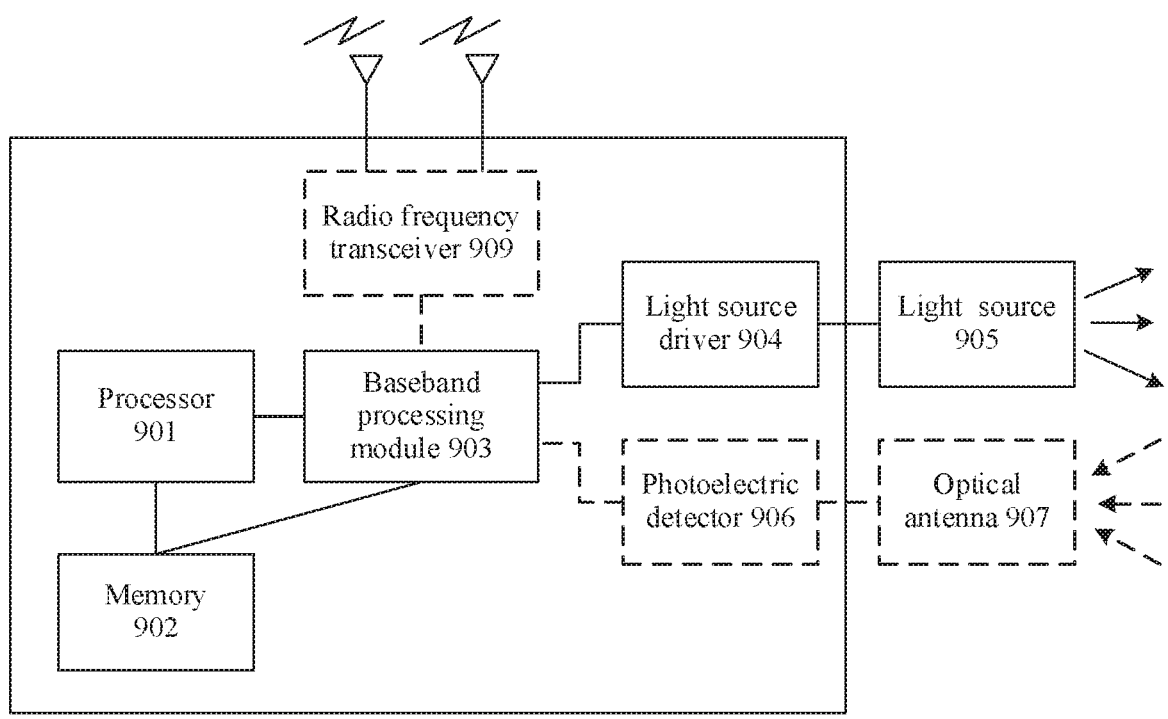
FIG. 9 is a schematic diagram of a hardware structure of another data transmission apparatus based on probability non-uniform modulation according to an embodiment of this application.

When the data transmission apparatus 90 based on probability non-uniform modulation is a transmit end in a radio frequency communication scenario, as shown in FIG. 9, the data transmission apparatus 90 based on probability non-uniform modulation may include one or more processors 901, one or more memories 902, one or more baseband processing modules 903, and one or more radio frequency transceivers 909. The radio frequency transceiver 909 is configured to receive or send a radio frequency signal. The processor 901 is configured to control, according to a program instruction stored in the memory 902, the baseband processing module 903 and the radio frequency transceiver 909 to perform an action performed by the transmit end in any one of the following method embodiments.

Embodiment 2 Related to a Transmit End

When the data transmission apparatus 90 based on probability non-uniform modulation is a transmit end in an optical wireless communications scenario, as shown in FIG. 9, the data transmission apparatus 90 based on probability non-uniform modulation may include one or more processors 901, one or more memories 902, one or more baseband processing modules 903, one or more light source drivers 904, and one or more light sources 905.

The memory 902 is configured to store a program instruction.

The processor 901 is configured to control, according to the program instruction stored in the memory 902, the baseband processing module 903, the light source driver 904, and the light source 905 to perform an action performed by the transmit end in any one of the following method embodiments.

The baseband processing module 903 is configured to generate a physical layer data frame, and send the physical layer data frame to the light source driver 904. The physical layer data frame may be a physical layer data frame mentioned below in this application.

The light source driver 904 is configured to generate a direct current or a direct current voltage, superpose the received physical layer data frame with the direct current or the direct current voltage to generate an electrical signal with a bias, and send the electrical signal with a bias to the light source 905.

The light source 905 is configured to generate an optical signal based on the electrical signal with a bias.

In some embodiments, the data transmission apparatus 90 based on probability non-uniform modulation may further include one or more radio frequency transceivers 909, configured to receive or send a radio frequency signal.

It should be noted that the processor 901, the memory 902, the baseband processing module 903, the light source driver 904, and the radio frequency transceiver 909 may be connected by using a bus. The baseband processing module 903 may perform channel estimation, and add a channel estimation sequence to the physical layer data frame, or may add a synchronization preamble to the physical layer data frame, or may add processing such as a light adjustment mode to the physical layer data frame.

In some embodiments, the data transmission apparatus 90 based on probability non-uniform modulation may further include one or more photoelectric detectors 906 and one or more optical antennas 907. For functions of the photoelectric detector 906 and the optical antenna 907, refer to related descriptions in the following embodiments related to a receive end.

Based on the transmit end, the channel encoder and the mapper shown in FIG. 4, or the equal-probability channel encoder and the non-equal-length Huffman mapper shown in FIG. 5, or the multi-level coder and the deterministic equal-length mapper shown in FIG. 6, or the single-level coder and the deterministic equal-length mapper shown in FIG. 7 may be located in the baseband processing module 903 at the transmit end.

An embodiment of this application further provides a data transmission apparatus based on probability non-uniform modulation. The data transmission apparatus 90 based on probability non-uniform modulation may be the receive end in the embodiments of this application. The data transmission apparatus 90 based on probability non-uniform modulation may be a receive end in a radio frequency communication scenario, or may be a receive end in an optical wireless communications scenario.

Embodiment 1 Related to a Receive End

When the data transmission apparatus 90 based on probability non-uniform modulation is a receive end in a radio frequency communication scenario, as shown in FIG. 9, the data transmission apparatus 90 based on probability non-uniform modulation includes one or more processors 901, one or more memories 902, one or more baseband processing modules 903, and one or more radio frequency transceivers 909. The radio frequency transceiver 909 is configured to receive or send a radio frequency signal. The processor 901 is configured to control, according to a program instruction stored in the memory 902, the baseband processing module 903 and the radio frequency transceiver 909 to perform an action performed by the receive end in any one of the following method embodiments.

Embodiment 2 Related to a Receive End

When the data transmission apparatus 90 based on probability non-uniform modulation is a receive end in an optical wireless communications scenario, as shown in FIG. 9, the data transmission apparatus 90 based on probability non-uniform modulation includes one or more processors 901, one or more memories 902, one or more baseband processing modules 903, one or more photoelectric detectors 906, and one or more optical antennas 907.

The memory 902 is configured to store a program instruction.

The processor 901 is configured to control, according to the program instruction stored in the memory 902, the baseband processing module 903, the photoelectric detector 906, and the optical antenna 907 to perform an action performed by the receive end in any one of the following method embodiments.

The optical antenna 907 is configured to receive an optical signal, and send the optical signal to the photoelectric detector 906.

The photoelectric detector 906 is configured to receive the optical signal, convert the optical signal into an electrical signal with a bias, and send the electrical signal with a bias to the baseband processing module 903. The electrical signal with a bias may be a current signal with a bias or a voltage signal with a bias.

The baseband processing module 903 is configured to receive the electrical signal with a bias, perform signal processing on the electrical signal with a bias to obtain a physical layer data frame, and perform probability non-uniform demodulation processing and decoding processing on data based on a probability non-uniform demodulation parameter. The probability non-uniform demodulation parameter is a demodulation parameter indicated by indication information in the physical layer data frame. The data is data that is carried in the physical layer data frame and on which probability non-uniform modulation is performed. The physical layer data frame may be a physical layer data frame mentioned below in this application.

In some embodiments, the data transmission apparatus 90 based on probability non-uniform modulation may further include one or more radio frequency transceivers 909, configured to receive or send a radio frequency signal.

It should be noted that the processor 901, the memory 902, the baseband processing module 903, the photoelectric detector 906, and the radio frequency transceiver 909 may be connected by using a bus. The baseband processing module 903 may perform channel estimation, and add a channel estimation sequence to the physical layer data frame, or may add a synchronization preamble to the physical layer data frame, or may add processing such as a light adjustment mode to the physical layer data frame.

In some embodiments, the data transmission apparatus 90 based on probability non-uniform modulation may further include one or more light source drivers 904 and one or more light sources 905. For functions of the light source driver 904 and the light source 905, refer to related descriptions in the foregoing embodiments related to the transmit end.

Based on the receive end, the demodulator and the decoder shown in FIG. 4, or the demodulator and the channel decoder shown in FIG. 5, or the multi-level decoder shown in FIG. 6, or the joint demapping decoder shown in FIG. 7 may be located in the baseband processing module 903 at the receive end.

Figure 10:
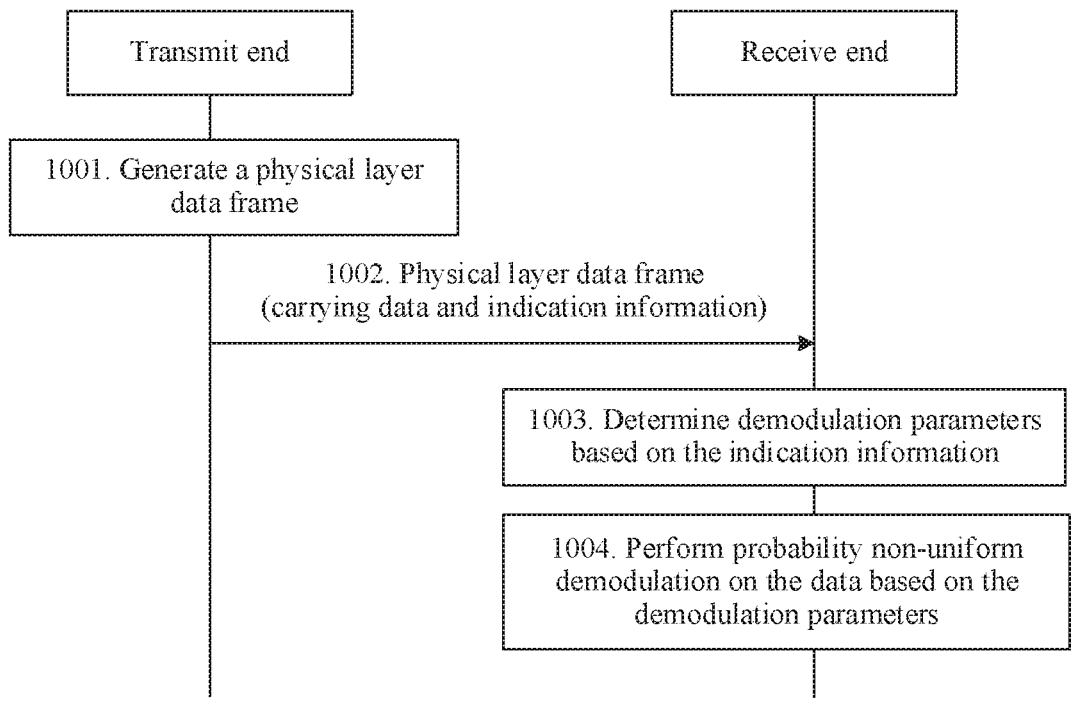
FIG. 10 is a flowchart of a data transmission method based on probability non-uniform modulation according to an embodiment of this application.

An embodiment of this application provides a data transmission method based on probability non-uniform modulation. As shown in FIG. 10, the method includes the following steps.

1001. A transmit end generates a physical layer data frame, where the physical layer data frame includes data on which probability non-uniform modulation is performed and indication information, and the indication information is used to indicate demodulation parameters for performing probability non-uniform demodulation on the data.

The physical layer data frame may be used for optical wireless communications.

The demodulation parameters include a modulation scheme for probability non-uniform modulation and a modulation order for probability non-uniform modulation. The demodulation parameters further include at least one of the following: a probability of each constellation symbol on which probability non-uniform modulation is performed, and a mapping relationship between each constellation symbol on which probability non-uniform modulation is performed and a bit stream. It should be noted that all constellation symbols in the embodiment shown in FIG. 10 are probability non-uniform constellation symbols.

In some embodiments, the indication information is located in a physical layer header of the physical layer data frame. In some embodiments, check protection is performed on the indication information is by using a physical layer header check sequence (Header Check Sequence, HCS for short).

A mapping relationship between a constellation symbol and a bit stream includes information about a bit stream corresponding to the constellation symbol. A constellation symbol may be obtained by modulating a corresponding bit stream. One constellation symbol may correspond to one or more bit streams. For example, FIG. 1 shows four mapping relationships between constellation symbols and bit streams.

In some embodiments, the demodulation parameters further include a quantity of bits corresponding to each constellation symbol on which probability non-uniform modulation is performed.

In some embodiments, a channel coding scheme may be further included.

For example, the channel coding scheme may be multi-level coding or single-level coding.

1002. The transmit end sends the physical layer data frame to the receive end.

1003. The receive end receives the physical layer data frame, and determines the demodulation parameters based on the indication information.

1004. The receive end performs probability non-uniform demodulation on the data based on the demodulation parameters.

In the method provided in this embodiment of this application, the transmit end sends the data on which probability non-uniform modulation is performed to the receive end, and the receive end performs probability non-uniform demodulation on the data, so that a communications system can obtain a better shaping gain, and when there is an input amplitude constraint or on a channel with shot noise, a transmission rate is made closer to a channel capacity or better bit error rate performance is obtained. In the method provided in this embodiment of this application, compared with probability uniform modulation, probability non-uniform modulation generates a non-equal-probability constellation symbol, so that source information entropy and input/output mutual information are larger, and a channel capacity achieved by the probability non-uniform constellation symbol is larger. Therefore, higher frequency band utilization can be obtained in a case of a same input amplitude constraint, same signal power, a same signal-to-noise ratio, and same bit error rate performance, thereby improving transmission efficiency of data on which probability non-uniform modulation is performed.

Different from a conventional probability uniform modulation scheme, probability non-uniform modulation can support a more flexible modulation order, which may not necessarily be $2^n$ ($n \geq 1$ and n is an integer). In other words, the modulation order for probability non-uniform modulation may be an odd number Even in a same modulation scheme, a quantity of bits corresponding to each constellation symbol, a probability of each constellation symbol, and a mapping relationship between a constellation symbol and a bit stream may be greatly different. FIG. 1 is used as an example. When a modulation order is 3, a quantity of bits corresponding to a constellation symbol in each of case 1 and case 2 is 2, and a quantity of bits corresponding to a constellation symbol in each of case 3 and case 4 is 3. Further, mapping relationships between constellation symbols and bit streams may be different even when modulation orders are the same and quantities of bits corresponding to all constellation symbols are the same. Different mapping relationships further cause different probabilities of all the constellation symbols, for example, case 3 and case 4 in FIG. 1. In order to successfully complete probability non-uniform demodulation of a constellation symbol, a demodulator at the receive end needs to completely know information such as a modulation order for probability non-uniform modulation, a quantity of bits corresponding to each constellation symbol, a probability of a constellation symbol, and a mapping relationship between a constellation symbol and a bit stream. Therefore, in this embodiment of this application, the transmit end generates the physical layer data frame based on the demodulation parameters required by the receive end, and sends the physical layer data frame to the receive end, so that the receive end can directly or indirectly extract the demodulation parameters from the received physical layer data frame, and complete probability non-uniform demodulation of the constellation symbol based on the demodulation parameters.

In some embodiments, before step 1001, the transmit end generates the data by using a multi-level coder and a deterministic equal-length mapper. In this case, in a specific implementation, step 1004 may include: performing, by the receive end, probability non-uniform demodulation on the data by using a multi-level decoder and the demodulation parameters. For details, refer to the foregoing manner 2.

In some embodiments, before step 1001, the transmit end generates the data by using a single-level coder and a deterministic equal-length mapper. In this case, in a specific implementation, step 1004 may include: performing, by the receive end, probability non-uniform demodulation on the data by using a joint demapping decoder and the demodulation parameters. For details, refer to the foregoing manner 3.

It should be noted that, in this embodiment of this application, when the data carried in the physical layer data frame is sent by using a single carrier, the data may be data obtained after single-carrier modulation is performed on a probability non-uniform constellation symbol. When the data is sent by using a plurality of carriers, the data may be data obtained after multi-carrier modulation is performed on a probability non-uniform constellation symbol.

The indication information may explicitly or implicitly indicate the demodulation parameters.

When the indication information explicitly indicates the demodulation parameters, the indication information may be the demodulation parameters. In this case, the receive end may directly obtain the demodulation parameters based on the physical layer data frame.

When the indication information implicitly indicates the demodulation parameters, the indication information may be either of the following two types of information:

(1) The indication information is a first identifier, and the first identifier is used to indicate the demodulation parameters.

In this case, in a specific implementation, step 1003 may include: determining, by the receive end based on the first identifier and a correspondence between identifiers and demodulation parameters, the demodulation parameters for performing probability non-uniform demodulation on the data, where the identifiers include the first identifier.

Figure 11:
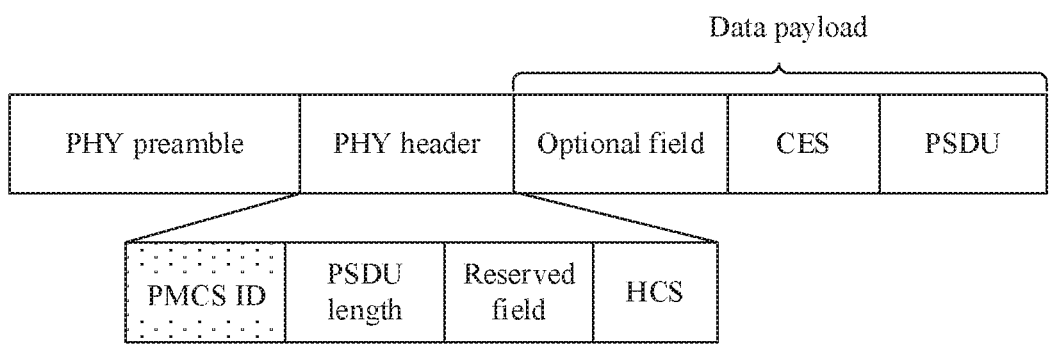
FIG. 11 is a schematic structural diagram of a physical layer data frame according to an embodiment of this application.

For example, as shown in FIG. 11, the physical layer data frame generated by the transmit end includes three parts: a physical layer preamble (PHY preamble), a physical layer header (PHY header), and a physical layer data payload (PHY payload).

The physical layer preamble may be used to perform frame synchronization with the receive end, and the preamble is a time domain sequence and does not require any channel coding or signal modulation.

The physical layer header includes a first identifier (which may be referred to as a probability modulation and coding scheme indicator (Probability Modulation and Coding Scheme Index, PMCS-ID for short)), a physical service data unit (PHY service data unit, PSDU for short) length (length), a reserved field (Reserved Fields), and a physical layer HCS.

The PMCS-ID is used to indicate the demodulation parameters. It should be noted that a modulation and coding scheme indicator (Modulation and Coding Scheme Index, MCS-ID for short) in the IEEE 802.11 standard protocol can indicate only a modulation scheme and a modulation order. Different from the MCS-ID, the PMCS-1D in this embodiment of this application not only can indicate a modulation scheme, but also can indicate a modulation order, a probability of each constellation symbol, a mapping relationship between each constellation symbol and a bit stream, a channel coding scheme, and the like in a same modulation scheme.

The PSDU length is used to identify a length of a PSDU in the physical layer data frame. The reserved field is used to support subsequent function expansion. The HCS is used to check the physical layer header.

The data payload includes an optional field (Optional Fields), a channel estimation sequence (Channel Estimation Sequence, CES for short), and a PSDU. The optional area is used for subsequent function expansion. The CES is used for channel estimation and channel equalization. The PSDU is valid data, and in this embodiment of this application, the PSDU may be data on which probability non-uniform modulation is performed.

Specifically, the PMCS-ID may include a plurality of bits used to indicate each piece of information in the demodulation parameters. The receive end may determine, based on a value of a bit in the PMCS-ID and a preset table of a correspondence between different bit values and information in the demodulation parameters, the demodulation parameters indicated by the PMCS-ID.

For example, the PMCS-ID may include m6 bits. $a_1$ to $a_{m1}$ bits are used to indicate a modulation scheme for probability non-uniform modulation. For a correspondence between values of the $a_1$ to $a_{m1}$ bits and the modulation scheme for probability non-uniform modulation, refer to Table 1. $a_{m1}$ to $a_{m3}$ bits are used to indicate a modulation order for probability non-uniform modulation. For a correspondence between values of the $a_{m1}$ to $a_{m2}$ bits and the modulation order for probability non-uniform modulation, refer to Table 2. $a_{m2}$ to $a_{m3}$ bits are used to indicate a quantity of bits corresponding to each constellation symbol. For a correspondence between values of the $a_{m2}$ to $a_{m3}$ bits and the quantity of bits corresponding to the constellation symbol, refer to Table 3. $a_{m3}$ to ag bits are used to indicate a probability of each constellation symbol. For a correspondence between values of the $a_{m3}$ to $a_{m4}$ bits and the probability of the constellation symbol, refer to Table 4. $a_{m4}$ to $a_{m5}$ bits are used to indicate a mapping relationship between a constellation symbol and a bit stream. For the mapping relationship between a constellation symbol and a bit stream and indicated by values of the $a_{m4}$ to $a_{m5}$ bits, refer to Table 5. $a_{m5}$ to $a_{m6}$ bits are used to indicate a channel coding scheme. For a correspondence between values of the $a_{m5}$ to $a_{m6}$ bits and the channel coding scheme, refer to Table 6. The PMCS-ID may further include another bit, used for subsequent function expansion.

TABLE 1

| $a_1$ | $a_2$ | ... | $a_{m1}$ | Modulation scheme |
|---|---|---|---|---|
| 0 | 0 | ... | 0 | $B_1$ |
| 0 | 0 | ... | 1 | $B_2$ |
| ... | | | | ... |
| 1 | 1 | ... | 1 | $B_{2m1}$ |

Note:
$B_1, B_2, \ldots,$ and $B_{2m1}$ each represent one modulation scheme.

TABLE 2

| $a_{m1}$ | $a_{m1+1}$ | ... | $a_{m2}$ | Modulation order |
|---|---|---|---|---|
| 0 | 0 | ... | 0 | $C_1$ |
| 0 | 0 | ... | 1 | $C_2$ |
| ... | | | | ... |
| 1 | 1 | ... | 1 | $C_{2m2-m1}$ |

Note:
$C_1, C_2, \ldots,$ and $C_{2m2-m1}$ each represent one modulation order.

TABLE 3

| $a_{m2}$ | $a_{m2+1}$ | ... | $a_{m3}$ | Quantity of bits |
|---|---|---|---|---|
| 0 | 0 | ... | 0 | $D_1$ |
| 0 | 0 | ... | 1 | $D_2$ |
| ... | | | | ... |
| 1 | 1 | ... | 1 | $D_{2m3-m2}$ |

Note:
$D_1, D_2, \ldots,$ and $D_{2m3-m2}$ each represent one quantity of bits.

TABLE 4

| $a_{m3}$ | $a_{m3+1}$ | ... | $a_{m4}$ | probability of a constellation symbol |
|---|---|---|---|---|
| 0 | 0 | ... | 0 | $[p_1^1, p_2^1, \ldots, p_u^1]$ |
| 0 | 0 | ... | 1 | $[p_1^2, p_2^2, \ldots, p_u^2]$ |
| ... | | | | ... |
| 1 | 1 | ... | 1 | $[p_1^{2m4-m3}, p_2^{2m4-m3}, \ldots, p_u^{2m4-m3}]$ |

Note:
u is a modulation order, and $p_1, p_2, \ldots,$ and $p_u$ each represent one probability of a constellation symbol.

TABLE 5

| $a_{m4}$ | $a_{m4+1}$ | ... | $a_{m5}$ | Mapping relationship |
|---|---|---|---|---|
| 0 | 0 | ... | 0 | $E_1$ |
| 0 | 0 | ... | 1 | $E_2$ |
| ... | | | | ... |
| 1 | 1 | ... | 1 | $E_{2m5-m4}$ |

Note:
$E_1, E_2, \ldots,$ and $E_{2m5-m4}$ each represent one mapping relationship.

TABLE 6

| $a_{m5}$ | $a_{m5+1}$ | ... | $a_{m6}$ | Channel coding scheme |
|---|---|---|---|---|
| 0 | 0 | ... | 0 | $F_1$ |
| 0 | 0 | ... | 1 | $F_2$ |
| ... | | | | ... |
| 1 | 1 | ... | 1 | $F_{2m6-m5}$ |

Note:
$F_1, F_2, \ldots,$ and $F_{2m6-m5}$ each represent one channel coding scheme.

In this case, after receiving the physical layer data frame, the receive end first performs data frame synchronization, and starts to perform channel estimation and channel equalization after completing the data frame synchronization. After the channel estimation and the channel equalization are completed, the demodulator performs probability non-uniform demodulation on the data. The method specifically includes: obtaining a PMCS-ID in a physical layer header, obtaining, based on the PMCS-ID and a preset table (for example, the foregoing Table 1 to Table 6) of a correspondence between different bit values and information in demodulation parameters, demodulation parameters indicated by the PMCS-ID, and performing probability non-uniform demodulation on the data based on the demodulation parameters. After probability non-uniform demodulation is performed on the data, a decoder may decode the data by using a message passing/propagation (Message Passing, MP for short) algorithm that can use soft information. For example, the MP algorithm may be a sum-product algorithm.

Further, the demodulator at the receive end may obtain the demodulation parameters indicated by the PMCS-ID after checking that the PMCS-ID is correct by using the check sequence. After the demodulator at the receive end fails to check the PMCS-ID or fails to demodulate or decode the data, the receive end and the transmit end may use a processing method such as data retransmission. For details, refer to the prior art.

In this implementation, the transmit end needs to add only the PMCS-ID to the physical layer data frame to enable the receive end to obtain the demodulation parameters, without needing to add all the demodulation parameters to the physical layer data frame, so that the demodulation parameters for probability non-uniform demodulation are carried with a relatively small information redundancy, thereby improving transmission efficiency, and saving transmission resources.

(2) The indication information includes a second identifier and a first information portion of the demodulation parameters, the second identifier is used to indicate a second information portion of the demodulation parameters, and the demodulation parameters include the first information portion and the second information portion.

In this case, in a specific implementation, step 503 may include: obtaining, by the receive end, the first information portion of the demodulation parameters based on the physical layer data frame: and determining, by the receive end based on the second identifier and a correspondence between identifiers and demodulation parameters, the second information portion of the demodulation parameters for performing probability non-uniform demodulation on the data, where the identifiers include the second identifier.

In some embodiments, the first information portion includes information A and information B, where the information A is a probability of each constellation symbol on which probability non-uniform modulation is performed, the information B is a mapping relationship between each constellation symbol on which probability non-uniform modulation is performed and a bit stream, and the information A and the information B are located in different fields in a physical layer header of the physical layer data frame.

It should be noted that, in probability non-uniform modulation, there may be a plurality of probabilities of each constellation symbol on which probability non-uniform modulation is performed and a plurality of mapping relationships between each constellation symbol on which probability non-uniform modulation is performed and a bit stream. If the receive end determines a probability or a mapping relationship by looking up the foregoing tables, the receive end needs to consume a large amount of time. In this case, the two pieces of information may be directly carried in the physical layer data frame, thereby reducing demodulation complexity of the receive end.

Certainly, in a specific implementation, other information in the demodulation parameters may be directly carried in the physical layer data frame based on a requirement. This is not limited in this embodiment of this application.

Figure 12:
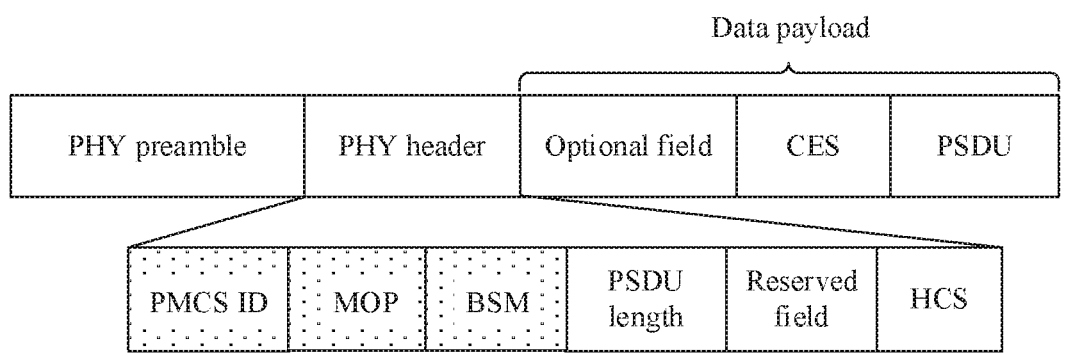
FIG. 12 is a schematic structural diagram of another physical layer data frame according to an embodiment of this application.

In this case, for the physical layer data frame generated by the transmit end, refer to FIG. 12. Compared with FIG. 11, in FIG. 12, a modulation order and probability (Modulation Order and Probability, MOP for short) module and a bit stream mapping (Bit-stream and Symbol Mapping, BSM for short) module are added to the physical layer header. The module may also be understood as a field.

The second identifier may also be referred to as a PMCS-ID. In this case, the PMCS-ID needs to indicate only some information in the demodulation parameters.

In an implementation, the PMCS-ID may indicate a modulation scheme for probability non-uniform modulation, information about a bit quantity corresponding to each constellation symbol on which probability non-uniform modulation is performed, and a modulation order for probability non-uniform modulation in the demodulation parameters.

The probability of each constellation symbol on which probability non-uniform modulation is performed may be included in the MOP module (or referred to as a MOP field, and the field may alternatively have another name). The mapping relationship between each constellation symbol on which probability non-uniform modulation is performed and a bit stream may be included in the BSM module (or referred to as a BSM field, and the field may alternatively have another name).

In this case, after receiving the physical layer data frame, the receive end first performs data frame synchronization, and starts to perform channel estimation and channel equalization after completing the data frame synchronization. After the channel estimation and the channel equalization are completed, the demodulator performs probability non-uniform demodulation on the data. The method specifically includes: obtaining a PMCS-ID in a physical layer header; obtaining, based on the PMCS-ID and a preset table (for example, the foregoing Table 1, Table 2, and Table 3) of a correspondence between different bit values and information in the demodulation parameters, a modulation scheme for probability non-uniform modulation, bit quantity information corresponding to each constellation symbol on which probability non-uniform modulation is performed, and a modulation order for probability non-uniform modulation in the demodulation parameters that are indicated by the PMCS-ID: obtaining, from the MOP module and the BSM module, a probability of each constellation symbol on which probability non-uniform modulation is performed and a mapping relationship between each constellation symbol on which probability non-uniform modulation is performed and a bit stream in the demodulation parameters: and performing probability non-uniform demodulation on the data based on the obtained demodulation parameters. After performing probability non-uniform demodulation on the data, the decoder may perform data decoding by using an MP algorithm (for example, a sum-product algorithm) that can use soft information.

In another implementation, the PMCS-ID may indicate a modulation scheme for probability non-uniform modulation and bit quantity information corresponding to each constellation symbol on which probability non-uniform modulation is performed in the demodulation parameters.

The modulation order for probability non-uniform modulation and the probability of each constellation symbol on which probability non-uniform modulation is performed in the demodulation parameters may be included in the MOP module (or referred to as an MOP field, and the field may alternatively have another name). The mapping relationship between each constellation symbol on which probability non-uniform modulation is performed and the bitstream may be included in the BSM module (or referred to as a BSM field, and the field may alternatively have another name).

In this case, after receiving the physical layer data frame, the receive end first performs data frame synchronization, and starts to perform channel estimation and channel equalization after completing the data frame synchronization. After the channel estimation and the channel equalization are completed, the demodulator performs probability non-uniform demodulation on the data. The method specifically includes: obtaining a PMCS-ID in a physical layer header; obtaining, based on the PMCS-1D and a preset table (for example, the foregoing Table 1 and Table 3) of a correspondence between different bit values and information in the demodulation parameters, a modulation scheme for probability non-uniform modulation and bit quantity information corresponding to each constellation symbol in the demodulation parameters that are indicated by the PMCS-ID; obtaining, from the MOP module and the BSM module, a modulation order for probability non-uniform modulation, a probability of each constellation symbol on which probability non-uniform modulation is performed, and a mapping relationship between each constellation symbol on which probability non-uniform modulation is performed and a bit stream in the demodulation parameters: and performing probability non-uniform demodulation on the data based on the obtained demodulation parameters. After performing probability non-uniform demodulation on the data, the decoder may perform data decoding by using an MP algorithm (for example, a sum-product algorithm) that can use soft information.

Further, the demodulator at the receive end may obtain the demodulation parameters indicated by the PMCS-ID and the demodulation parameters included in the MOP module and the BSM module after checking that the PMCS-ID, the MOP module, and the BSM module are correct by using the check sequence. After the demodulator at the receive end fails to check the PMCS-ID, the MOP module, or the BSM module, or fails to demodulate and decode the data, the receive end and the transmit end may use a processing method such as data retransmission. For details, refer to the prior art.

In this implementation, the transmit end adds the PMCS-ID to the physical layer data frame, and adds some of the demodulation parameters to the physical layer data frame, so that the receive end can directly obtain the some of the demodulation parameters, thereby reducing a demodulation delay and demodulation complexity of the demodulator.

Compared with probability uniform modulation, probability non-uniform modulation implemented in the method provided in some embodiments of this application generates a non-equal-probability constellation symbol, so that source information entropy and input/output mutual information are larger, and a channel capacity achieved by the probability non-uniform constellation symbol is larger. Therefore, higher frequency band utilization can be obtained in a case of a same input amplitude constraint, same signal power, a same signal-to-noise ratio, and same bit error rate performance. In some embodiments of this application, the added MOP and BSM modules can directly carry information in the demodulation parameters, thereby supporting a constellation symbol probability that is more flexible and has higher quantization accuracy. The probability non-uniform constellation symbol in some embodiments of this application may be extended to N-dimensional signal space ($N \geq 1$ and N is a positive integer).

The foregoing mainly describes the solutions of the embodiments of this application from a perspective of a method. It may be understood that, to implement the foregoing functions, the data transmission apparatus based on probability non-uniform modulation includes corresponding hardware structures and/or software modules for performing the functions. A person skilled in the art should easily be aware that, in combination with units and algorithm steps of the examples described in the embodiments disclosed in this specification, this application may be implemented by hardware or a combination of hardware and computer software. Whether a function is performed by hardware or hardware driven by computer software depends on particular applications and design constraints of the technical solutions. A person skilled in the art may use different methods to implement the described functions for each particular application, but it should not be considered that the implementation goes beyond the scope of this application.

In the embodiments of this application, functional units of the data transmission apparatus based on probability non-uniform modulation may be divided based on the foregoing method examples. For example, each functional unit may be obtained through division based on each corresponding function, or two or more functions may be integrated into one processing unit. The integrated unit may be implemented in a form of hardware, or may be implemented in a form of a software functional unit. It should be noted that, in this embodiment of this application, unit division is exemplary, and is merely a logical function division. In actual implementation, another division manner may be used.

Figure 13:
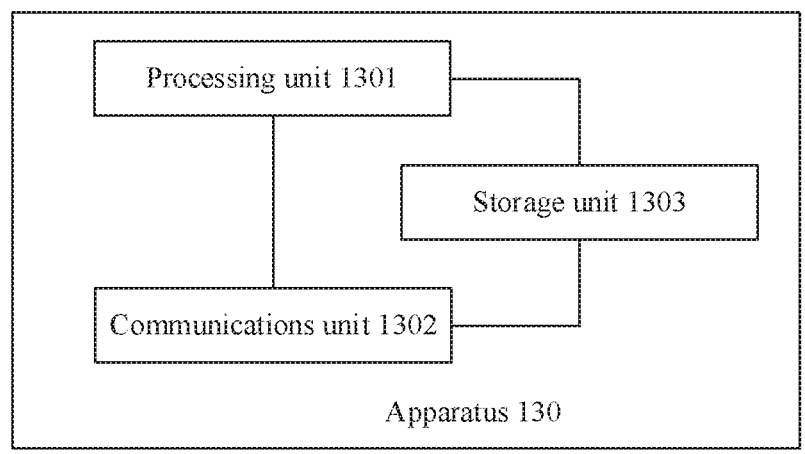
FIG. 13 is a schematic composition diagram of an apparatus according to an embodiment of this application.

For example, when an integrated function module is used, FIG. 13 is a possible schematic structural diagram of an apparatus in the foregoing embodiments. The apparatus 130 may be the foregoing transmit end or receive end. Referring to FIG. 13, the apparatus 130 may include a processing unit 1301 and a communications unit 1302. The apparatus may further include a storage unit 1303.

When the apparatus 130 is the transmit end, the processing unit 1301 is configured to control and manage an action of the transmit end. For example, the processing unit 1301 is configured to support the transmit end in performing steps 1001 and 1002 in FIG. 10 and/or an action performed by the transmit end in another process described in the embodiments of this application. The communications unit 1302 is configured to support the transmit end in communicating with another network device, for example, communicating with the receive end in FIG. 10. The storage unit 1303 is configured to store program code and data of the transmit end.

When the apparatus 130 is the receive end, the processing unit 1301 is configured to control and manage an action of the receive end. For example, the processing unit 1301 is configured to support the receive end in performing steps 1003 and 1004 in FIG. 10 and/or an action performed by the receive end in another process described in the embodiments of this application. The communications unit 1302 is configured to support the receive end in communicating with another network device, for example, communicating with the transmit end in FIG. 10. The storage unit 1303 is configured to store program code and data of the receive end.

In one case, the processing unit 1301 may be a processor or a controller, the communications unit 1302 may be a communications interface, and the storage unit 1303 may be a memory. When the processing unit 1301 is a processor, the communications unit 1302 is a communications interface, and the storage unit 1303 is a memory, the apparatus in this embodiment of this application may be the apparatus shown in FIG. 8.

When the apparatus shown in FIG. 8 is the transmit end, the processor 801 is configured to control and manage an action of the transmit end. For example, the processor 801 is configured to support the transmit end in performing steps 1001 and 1002 in FIG. 10 and/or an action performed by the transmit end in another process described in the embodiments of this application. The communications interface 804 is configured to support the transmit end in communicating with another network device, for example, communicating with the receive end in FIG. 10. The memory 803 is configured to store program code and data of the transmit end.

When the apparatus shown in FIG. 8 is the receive end, the processor 801 is configured to control and manage an action of the receive end. For example, the processor 801 is configured to support the receive end in performing steps 1003 and 1004 in FIG. 10 and/or an action performed by the receive end in another process described in the embodiments of this application. The communications interface 804 is configured to support the receive end in communicating with another network device, for example, communicating with the transmit end in FIG. 10. The memory 803 is configured to store program code and data of the receive end.

In another case, the apparatus in this embodiment of this application may be the apparatus shown in FIG. 9.

When the apparatus shown in FIG. 9 is the transmit end, the processing unit 1301 may be the baseband processing module 903, the communications unit 1302 may include the light source driver 904 and the light source 905, and the storage unit 1303 may be the memory 902. The baseband processing module 903, the light source driver 904, and the light source 905 perform, under control of the processor 901 based on the program instruction stored in the memory 902, the action of the transmit end in the foregoing method. For functions of the baseband processing module 903, the light source driver 904, and the light source 905, refer to the foregoing descriptions. Details are not described herein again.

When the apparatus shown in FIG. 9 is the receive end, the processing unit 1301 may be the baseband processing module 903, the communications unit 1302 may include the photoelectric detector 906 and the optical antenna 907, and the storage unit 1303 may be the memory 902. The baseband processing module 903, the photoelectric detector 906, and the optical antenna 907 perform, under control of the processor 901 based on the program instruction stored in the memory 902, the action of the receive end in the foregoing method. For functions of the baseband processing module 903, the photoelectric detector 906, and the optical antenna 907, refer to the foregoing descriptions. Details are not described herein again. An embodiment of this application further provides a computer-readable storage medium, including an instruction. When the instruction is run on a computer, the computer is enabled to perform the foregoing method.

An embodiment of this application further provides a computer program product including an instruction. When the computer program product is run on a computer, the computer is enabled to perform the foregoing method.

All or some of the foregoing embodiments may be implemented by using software, hardware, firmware, or any combination thereof. When a software program is used to implement the embodiments, the embodiments may be implemented completely or partially in a form of a computer program product. The computer program product includes one or more computer instructions. When the computer program instructions are loaded and executed on the computer, the procedure or functions according to the embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (Digital Subscriber Line, DSL for short)) or wireless (for example, infrared, radio, or microwave) manner. The computer storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (Solid State Disk, SSD for short)), or the like.

Although this application is described with reference to the embodiments, in a process of implementing this application that claims protection, persons skilled in the art may understand and implement another variation of the disclosed embodiments by viewing the accompanying drawings, disclosed content, and the accompanying claims. In the claims, "including" does not exclude another component or another step, and "a" or "one" does not exclude a meaning of plurality. A single processor or another unit may implement several functions enumerated in the claims. Some measures are recorded in dependent claims that are different from each other, but this does not mean that these measures cannot be combined to produce a better effect.

Although this application is described with reference to specific features and the embodiments thereof, obviously, various modifications and combinations may be made to them without departing from the spirit and scope of this application. Correspondingly, the specification and accompanying drawings are merely example description of this application defined by the accompanying claims, and is considered as any of or all modifications, variations, combinations or equivalents that cover the scope of this application.

What is claimed is:

1. A data transmission method implemented by a transmit end, wherein the data transmission method comprises:
   generating a physical layer data frame comprising data and indication information, wherein the data are modulated by a probability non-uniform modulation, wherein the indication information indicates demodulation parameters for performing a probability non-uniform demodulation on the data, and wherein the demodulation parameters comprise a modulation scheme for the probability non-uniform modulation, a modulation order for the probability non-uniform modulation, and at least one of a probability of each constellation symbol on which the probability non-uniform modulation is performed, or a mapping relationship between the each constellation symbol and a corresponding bit stream, wherein the each constellation symbol is modulated by the probability non-uniform modulation; and
   sending the physical layer data frame to a receive end.

2. A data transmission method implemented by a receive end, wherein the data transmission method comprises:
   receiving a physical layer data frame comprising data and indication information, wherein the data are modulated by a probability non-uniform modulation, wherein the indication information indicates demodulation parameters for performing a probability non-uniform demodulation on the data, wherein the demodulation parameters comprise a modulation scheme for the probability non-uniform modulation, a modulation order for the probability non-uniform modulation, and at least one of a probability of each constellation symbol, or a mapping relationship between the each constellation symbol and a corresponding bit stream, wherein the each constellation symbol is modulated by the probability non-uniform modulation;
   determining the demodulation parameters based on the indication information; and
   performing the probability non-uniform demodulation on the data based on the demodulation parameters.

3. A data transmission apparatus comprising:
   a memory configured to store computer-executable instructions; and
   a processor coupled to the memory, wherein the computer executable instructions cause the processor to be configured to:
      generate a physical layer data frame comprising data and indication information, wherein the data are modulated by a probability non-uniform modulation, wherein the indication information indicates demodulation parameters for performing a probability non-uniform demodulation on the data, and wherein the demodulation parameters comprise a modulation scheme for the probability non-uniform modulation, a modulation order for the probability non-uniform modulation, and at least one of a probability of each constellation symbol, or a mapping relationship between the each constellation symbol and a corresponding bit stream, wherein the each constellation symbol is modulated by the probability non-uniform modulation; and
      send the physical layer data frame to a receive end.

4. The data transmission apparatus of claim 3, wherein the demodulation parameters further comprise a quantity of bits corresponding to the each constellation symbol.

5. The data transmission apparatus of claim 3, wherein the indication information comprises the demodulation parameters.

6. The data transmission apparatus of claim 3, wherein the indication information comprises a first identifier, and wherein the first identifier indicates the demodulation parameters.

7. The data transmission apparatus of claim 3, wherein the indication information comprises a second identifier and a first information portion of the demodulation parameters, wherein the second identifier indicates a second information portion of the demodulation parameters, and wherein the demodulation parameters further comprise the first information portion and the second information portion.

8. The data transmission apparatus of claim 7, wherein the first information portion comprises information A and information B, wherein the information A is the probability of the each constellation symbol, wherein the information B is the mapping relationship, and wherein the information A and the information B are located in different fields in a physical layer header of the physical layer data frame.

9. The data transmission apparatus of claim 3, wherein the computer executable instructions further cause the processor to be configured to:
   generate the data using a multi-level coder and a deterministic equal-length mapper; or
   generate the data using a single-level coder and the deterministic equal-length mapper.

10. The data transmission apparatus of claim 3, wherein the indication information is located in a physical layer header of the physical layer data frame.

11. The data transmission apparatus of claim 3, wherein the physical layer data frame is for optical wireless communications.

12. A data transmission apparatus modulation, comprising:
   a memory configured to store computer executable instructions; and
   a processor coupled to the memory, wherein the computer executable instructions cause the processor to be configured to:
   receive a physical layer data frame comprising data and indication information, wherein the data are modulated by a probability non-uniform modulation, wherein the indication information indicates demodulation parameters for performing a probability non-uniform demodulation on the data, and wherein the demodulation parameters comprise a modulation scheme for the probability non-uniform modulation, a modulation order for the probability non-uniform modulation, and at least one of a probability of each constellation symbol, or a mapping relationship between the each constellation symbol and a corresponding bit stream, wherein the each constellation symbol is modulated by the probability non-uniform modulation;

determine the demodulation parameters based on the indication information; and perform the probability non-uniform demodulation on the data based on the demodulation parameters.

13. The data transmission apparatus of claim 12, wherein the demodulation parameters further comprise a quantity of bits corresponding to the each constellation symbol.

14. The data transmission apparatus of claim 12, wherein the indication information comprises the demodulation parameters.

15. The data transmission apparatus of claim 12, wherein the indication information comprises a first identifier, wherein the first identifier indicates the demodulation parameters, wherein the computer executable instructions further cause the processor to be configured to determine, based on the first identifier and a correspondence between a plurality of identifiers and the demodulation parameters, the demodulation parameters for performing the probability non-uniform demodulation on the data, and wherein the identifiers comprise the first identifier.

16. The data transmission apparatus of claim 12, wherein the indication information further comprises a second identifier and a first information portion of the demodulation parameters, wherein the second identifier indicates a second information portion of the demodulation parameters, wherein the demodulation parameters further comprise the first information portion and the second information portion, and wherein the computer executable instructions further cause the processor to be configured to:

obtain the first information portion based on the physical layer data frame; and determine, based on the second identifier and a correspondence between a plurality of identifiers and the demodulation parameters, the second information portion, wherein the identifiers comprise the second identifier.

17. The data transmission apparatus of claim 16, wherein the first information portion comprises information A and information B, wherein the information A is the probability of the each constellation symbol, wherein the information B is the mapping relationship, and wherein the information A and the information B are located in different fields in a physical layer header of the physical layer data frame.

18. The data transmission apparatus of claim 12, wherein the computer executable instructions further cause the processor to be configured to:

perform the probability non-uniform demodulation on the data using a multi-level decoder and the demodulation parameters when the data is based on a multi-level coder and a deterministic equal-length mapper; and perform the probability non-uniform demodulation on the data using a joint demapping decoder and the demodulation parameters when the data is based on a single-level coder and the deterministic equal-length mapper.

19. A computer program product comprising computer-executable instructions for storage on a non-transitory computer-readable storage medium that, when executed by a processor, cause a transmit end to:

generate a physical layer data frame comprising data and indication information, wherein the data are modulated by a probability non-uniform modulation, wherein the indication information indicates demodulation parameters for performing a probability non-uniform demodulation on the data, and wherein the demodulation parameters comprise a modulation scheme for the probability non-uniform modulation, a modulation order for the probability non-uniform modulation, and at least one of a probability of each constellation symbol, or a mapping relationship between the each constellation symbol and a corresponding bit stream, wherein the each constellation symbol is modulated by the probability non-uniform modulation; and send the physical layer data frame to a receive end.

20. A computer program product comprising computer-executable instructions for storage on a non-transitory computer-readable storage medium that, when executed by a processor, cause a receive end to:

receive a physical layer data frame comprising data and indication information, wherein the data are modulated by a probability non-uniform modulation, wherein the indication information indicates demodulation parameters for performing a probability non-uniform demodulation on the data, wherein the demodulation parameters comprise a modulation scheme for the probability non-uniform modulation, a modulation order for the probability non-uniform modulation, and at least one of a probability of each constellation symbol, or a mapping relationship between the each constellation symbol and a corresponding bit stream, wherein the each constellation symbol is modulated by the probability non-uniform modulation;

determine the demodulation parameters based on the indication information; and perform the probability non-uniform demodulation on the data based on the demodulation parameters.

* * * * *

UNITED STATES PATENT AND TRADEMARK OFFICE
CERTIFICATE OF CORRECTION

| | | |
|---|---|---|
| PATENT NO. | : 11,303,498 B2 | |
| APPLICATION NO. | : 17/046500 | |
| DATED | : April 12, 2022 | |
| INVENTOR(S) | : Wei Huang and Ping Fang | |

It is certified that error appears in the above-identified patent and that said Letters Patent is hereby corrected as shown below:

In the Claims

Claim 12, Column 30, Line 59: "apparatus modulation, comprising:" should read "apparatus comprising:"

Signed and Sealed this
Seventh Day of June, 2022

Katherine Kelly Vidal
*Director of the United States Patent and Trademark Office*